(12) United States Patent
Xu et al.

(10) Patent No.: US 12,232,399 B2
(45) Date of Patent: Feb. 18, 2025

(54) DISPLAY SUBSTRATE, DISPLAY PANEL, AND METHOD OF MANUFACTURING DISPLAY SUBSTRATE HAVING SCAN DRIVING CIRCUIT IN NON-LIGHT-EMITTING REGION OF PIXEL UNITS

(71) Applicant: BOE TECHNOLOGY GROUP CO., LTD., Beijing (CN)

(72) Inventors: Pan Xu, Beijing (CN); Zhidong Yuan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/754,000

(22) PCT Filed: Apr. 28, 2021

(86) PCT No.: PCT/CN2021/090437
§ 371 (c)(1),
(2) Date: Mar. 21, 2022

(87) PCT Pub. No.: WO2022/226818
PCT Pub. Date: Nov. 3, 2022

(65) Prior Publication Data
US 2024/0122034 A1    Apr. 11, 2024

(51) Int. Cl.
| | |
|---|---|
| *H10K 59/80* | (2023.01) |
| *H10K 59/12* | (2023.01) |
| *H10K 59/122* | (2023.01) |

(52) U.S. Cl.
CPC ... *H10K 59/80522* (2023.02); *H10K 59/1201* (2023.02); *H10K 59/122* (2023.02); *H10K 59/80523* (2023.02)

(58) Field of Classification Search
CPC ......... H10K 59/80522; H10K 59/1201; H10K 59/122; H10K 59/80523
See application file for complete search history.

(56) References Cited

U.S. PATENT DOCUMENTS

| | | |
|---|---|---|
| 9,960,219 B2 | 5/2018 | Lee et al. |
| 10,026,922 B2 | 7/2018 | Yasukawa |

(Continued)

FOREIGN PATENT DOCUMENTS

| | | |
|---|---|---|
| CN | 106486522 A | 3/2017 |
| CN | 106803544 A | 6/2017 |

(Continued)

OTHER PUBLICATIONS

International Search Report and Written Opinion dated Jan. 26, 2022, for corresponding PCT Application No. PCT/CN2021/090437.

(Continued)

*Primary Examiner* — Michael Jung
(74) *Attorney, Agent, or Firm* — Kinney & Lange, P.A.

(57) ABSTRACT

A display substrate, a display panel and a method of manufacturing a display substrate are provided. The display substrate includes: a substrate; a plurality of pixel units including at least a first pixel unit including a first light-emitting region and a first non-light-emitting region; a first light-emitting element arranged in the first light-emitting region, including a first electrode, a light-emitting layer and a second electrode; a scan driving circuit arranged in the first non-light-emitting region; and a first auxiliary electrode located in a first partial region in the first non-light-emitting region, wherein the scan driving circuit includes a plurality of scan driving sub-circuits located in a second partial region in the first non-light-emitting region; an orthographic projection of the first partial region on the substrate overlaps an orthographic projection of the second partial region on the (Continued)

substrate, and the first auxiliary electrode is electrically connected to the second electrode.

19 Claims, 12 Drawing Sheets

(56) References Cited

U.S. PATENT DOCUMENTS

| | | | |
|---|---|---|---|
| 10,103,213 B2 | 10/2018 | Oh et al. | |
| 10,269,880 B2 | 4/2019 | Lee et al. | |
| 10,403,705 B2 | 9/2019 | Oh et al. | |
| 10,964,772 B2 | 3/2021 | Xu et al. | |
| 2016/0037608 A1* | 2/2016 | Ikeda | H05B 33/12 362/235 |
| 2016/0253953 A1* | 9/2016 | Yang | G09G 3/2074 345/214 |
| 2017/0062545 A1 | 3/2017 | Oh et al. | |
| 2017/0125495 A1 | 5/2017 | Lee et al. | |
| 2017/0125506 A1 | 5/2017 | Kim | |
| 2017/0250367 A1 | 8/2017 | Yasukawa | |
| 2017/0330513 A1* | 11/2017 | Hong | H10K 59/131 |
| 2018/0138256 A1 | 5/2018 | Han et al. | |
| 2018/0212005 A1 | 7/2018 | Lee et al. | |
| 2018/0366066 A1 | 12/2018 | Kim et al. | |
| 2019/0005880 A1 | 1/2019 | Sato et al. | |
| 2019/0013380 A1 | 1/2019 | Oh et al. | |
| 2020/0176541 A1 | 6/2020 | Xu et al. | |
| 2021/0020661 A1* | 1/2021 | Katsuta | G02F 1/167 |
| 2021/0257581 A1 | 8/2021 | Wang et al. | |
| 2022/0037615 A1 | 2/2022 | Xu et al. | |
| 2022/0052143 A1* | 2/2022 | Moon | H10K 59/1315 |

FOREIGN PATENT DOCUMENTS

| | | |
|---|---|---|
| CN | 106803547 A | 6/2017 |
| CN | 108511506 A | 9/2018 |
| CN | 109524437 A | 3/2019 |
| CN | 109768182 A | 5/2019 |
| CN | 110085648 A | 8/2019 |
| CN | 110634918 A | 12/2019 |
| CN | 110739338 A | 1/2020 |
| CN | 111354274 A | 6/2020 |
| CN | 111430415 A | 7/2020 |

OTHER PUBLICATIONS

Partial European Search Report for European Application No. 21938304.9, dated Mar. 5, 2024, 14 pages.

* cited by examiner

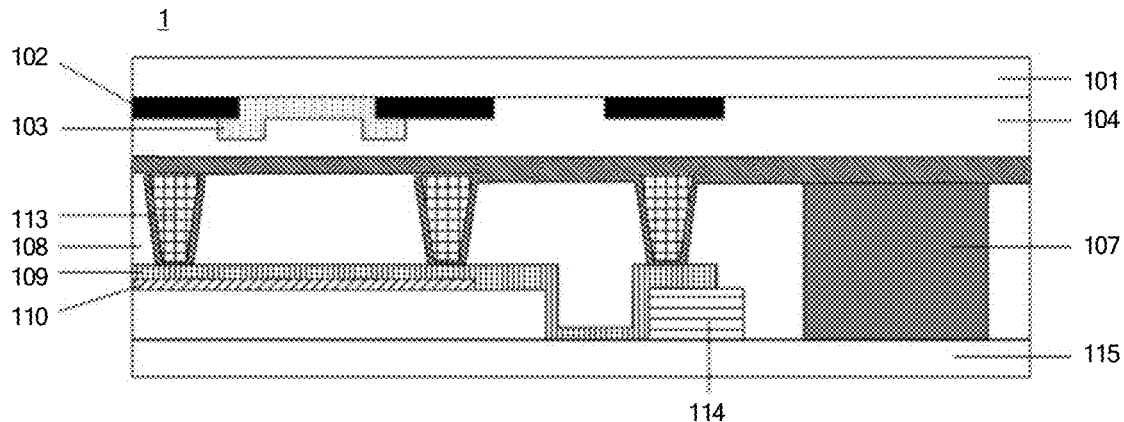

| A substrate including a plurality of pixel units is provided, the plurality of pixel units are arranged on the substrate in an array in a row direction and a column direction, and the plurality of pixel units include at least a first pixel unit including a first light-emitting region and a first non-light-emitting region | — S191 |

↓

| A scan driving circuit is formed in the first non-light-emitting region | — S192 |

↓

| A first auxiliary electrode is formed on a side of the scan driving circuit away from the substrate, and the first auxiliary electrode is located in a first partial region of the first non-light-emitting region | — S193 |

FIG. 19

DISPLAY SUBSTRATE, DISPLAY PANEL, AND METHOD OF MANUFACTURING DISPLAY SUBSTRATE HAVING SCAN DRIVING CIRCUIT IN NON-LIGHT-EMITTING REGION OF PIXEL UNITS

CROSS-REFERENCE TO RELATED APPLICATION

This application is a Section 371 National Stage Application of International Application No. PCT/CN2021/090437, filed on Apr. 28, 2021, entitled "DISPLAY SUBSTRATE, DISPLAY PANEL, AND METHOD OF MANUFACTURING DISPLAY SUBSTRATE", incorporated herein by reference in its entirety.

TECHNICAL FIELD

The present disclosure relates to a field of a display technology, in particular to a display substrate, a display panel and a method of manufacturing a display substrate.

BACKGROUND

Organic Light Emitting Diode (OLED) display technology is gradually being widely used and has become the most potential display technology to replace Liquid Crystal Display (LCD). Compared with LCD display technology, OLED display technology has a better experience in terms of picture quality, response speed, lightness and so on.

However, OLED display technology is undoubtedly much more complicated than LCD display technology. In particular, a circuit of OLED panel is complex, and various corresponding technologies for different application scenarios may not be unified. For example, it is necessary to address a voltage rise (IR Rise) of a cathode of a large-size top-emitting OLED. For another example, the OLED is a current-type device, a power source is required to make a pixel self-luminous, and a power line for supplying power to the light emitting device needs to occupy a large border, which results in a poor appearance.

SUMMARY

In view of this, the embodiments of the present disclosure provide a display substrate, a display panel and a method of manufacturing a display substrate.

The embodiments of the present disclosure provide a display substrate, including: a substrate; a plurality of pixel units arranged on the substrate in an array in a row direction and a column direction, wherein the plurality of pixel units include at least a first pixel unit including a first light-emitting region and a first non-light-emitting region; a first light-emitting element arranged in the first light-emitting region, wherein the first light-emitting element includes a first electrode, a light-emitting layer and a second electrode; a scan driving circuit arranged in the first non-light-emitting region; and a first auxiliary electrode arranged on a side of the scan driving circuit away from the substrate, wherein the first auxiliary electrode is located in a first partial region in the first non-light-emitting region, wherein the first auxiliary electrode is arranged in the row direction or the column direction; the scan driving circuit includes a plurality of scan driving sub-circuits located in a second partial region in the first non-light-emitting region; an orthographic projection of the first partial region in the first non-light-emitting region on the substrate overlaps an orthographic projection of the second partial region in the first non-light-emitting region on the substrate, and the first auxiliary electrode is electrically connected to the second electrode.

In some embodiments, the first auxiliary electrode is located in the same layer as the first electrode.

In some embodiments, the plurality of pixel units further include a second pixel unit including a second light-emitting region and a second non-light-emitting region, and no scan driving circuit is provided in the second non-light-emitting region.

In some embodiments, the display substrate further includes: a second light-emitting element arranged in the second light-emitting region, wherein the second light-emitting element includes a third electrode, a light-emitting layer and a fourth electrode; and a second auxiliary electrode located in a first partial region in the second non-light-emitting region, wherein the second auxiliary electrode is located in the same layer as the third electrode, the third electrode is located in the same layer as the first electrode, the second auxiliary electrode is arranged parallel to the first auxiliary electrode, and the second auxiliary electrode is electrically connected to the fourth electrode.

In some embodiments, the display substrate further includes: a source and/or drain electrode arranged on a side of a layer of the third electrode close to the substrate, wherein the source and/or drain electrode is located in the second non-light-emitting region; and a third auxiliary electrode located in a second partial region in the second non-light-emitting region, wherein an orthographic projection of an extension direction of the third auxiliary electrode on the substrate is in contact with an orthographic projection of an extension direction of the second auxiliary electrode on the substrate, an orthographic projection of the source and/or drain electrode on the substrate is spaced apart from an orthographic projection of the second partial region in the second non-light-emitting region on the substrate, the third auxiliary electrode is arranged in the same layer as the source and/or drain electrode, and the third auxiliary electrode is electrically connected to the second auxiliary electrode.

In some embodiments, one second auxiliary electrode corresponds to one or more rows of second pixel units; and/or one third auxiliary electrode corresponds to one or more columns of second pixel units.

In some embodiments, the display substrate further includes a first signal line; wherein the first auxiliary electrode includes: a first body portion; and a first narrowed portion connected to the first body portion, wherein an orthographic projection of the first narrowed portion on the substrate overlaps an orthographic projection of the first signal line on the substrate.

In some embodiments, the display substrate further includes a first signal line; wherein the second auxiliary electrode includes: a second body portion; and a second narrowed portion connected to the second body portion, wherein an orthographic projection of the second narrowed portion on the substrate overlaps an orthographic projection of the first signal line on the substrate.

In some embodiments, the display substrate further includes a second signal line; wherein the third auxiliary electrode includes: a third body portion; and a third narrowed portion connected to the third body portion, wherein an orthographic projection of the third narrowed portion on the substrate overlaps an orthographic projection of the second signal line on the substrate.

In some embodiments, the display substrate further includes: a non-display region; and a second electrode bus arranged in the non-display region for transmitting a reference voltage signal to the second electrode and/or the fourth electrode.

In some embodiments, the first auxiliary electrode and the second auxiliary electrode are arranged in the same layer as the second electrode bus, the first auxiliary electrode is connected to the second electrode bus, and the second auxiliary electrode is connected to the second electrode bus; or the third auxiliary electrode is arranged in the same layer as the fourth electrode bus, and the third auxiliary electrode is connected to the fourth electrode bus.

In some embodiments, the display substrate further includes: a stack of a planarization layer and an insulating layer arranged between the second auxiliary electrode and the third auxiliary electrode, wherein the planarization layer includes a first via hole, the insulating layer includes a second via hole, and an orthographic projection of the first via hole on the substrate overlaps an orthographic projection of the second via hole on the substrate; and the first auxiliary electrode is electrically connected to the second auxiliary electrode through the first via hole and the second via hole.

In some embodiments, the first via hole and the second via hole are circular via holes, and a diameter of the second via hole is greater than that of the first via hole; or the first via hole and the second via hole are polygonal via holes, and an area of the second via hole is greater than that of the first via hole.

In some embodiments, the display substrate further includes: a pixel defining layer arranged between the second electrode and the first auxiliary electrode, wherein the pixel defining layer includes a third via hole, and the first auxiliary electrode is electrically connected to the second electrode through the first via hole; or a pixel defining layer arranged between the fourth electrode and the second auxiliary electrode, wherein the pixel defining layer includes a third via hole, and the second auxiliary electrode is electrically connected to the fourth electrode through the third via hole.

In some embodiments, the first via hole is a polygonal via hole, the third via hole is a strip via hole, and an area of the strip via hole is greater than that of the first via hole.

In some embodiments, an orthographic projection of the first via hole is spaced apart from an orthographic projection of the third via hole on the substrate.

In some embodiments, an orthographic projection of the pixel defining layer on the substrate covers the first non-light-emitting region; and/or the orthographic projection of the pixel defining layer on the substrate covers the second non-light-emitting region.

In some embodiments, one first auxiliary electrode corresponds to one or more rows of first pixel units.

In some embodiments, one scan driving sub-circuit corresponds to one or more columns of first pixel units.

In some embodiments, a shape of the display substrate includes any one of a square, a rectangle, a polygon and a shape with an arc boundary.

In some embodiments, for a display substrate with a heart-shaped boundary, a plurality of pixel units are respectively located in different display regions, and each display region has an exclusive scan driving sub-circuit.

In some embodiments, the display substrate with the heart-shaped boundary includes a display region at a tip of the heart-shape and two symmetrical display regions at a head of the heart-shape, and the scan driving sub-circuit is arranged in the column direction.

In some embodiments, the first electrode includes a multi-layer metal structure having a cross-section with a shape of Chinese character "工".

In some embodiments, the first electrode includes a stack of indium tin oxide layer, aluminum layer and indium tin oxide layer.

In some embodiments, the first non-light-emitting region is an L-shaped region.

In some embodiments, the light-emitting layer includes an organic light emitting diode, the first electrode and the third electrode are an anode of the organic light emitting diode, and the second electrode and the fourth electrode are a cathode of the organic light emitting diode; and the scan driving circuit includes a gate driving circuit.

In some embodiments, the cathode contains a transparent conductive material, and
the anode contains a metal material.

The embodiments of the present disclosure provide a display panel including the display substrate described above.

The embodiments of the present disclosure provide a method of manufacturing a display substrate, including: providing a substrate including a plurality of pixel units, wherein the plurality of pixel units are arranged on the substrate in an array in a row direction and a column direction, the plurality of pixel units include at least a first pixel unit including a first light-emitting region and a first non-light-emitting region; forming a scan driving circuit in the first non-light-emitting region; and forming a first auxiliary electrode on a side of the scan driving circuit away from the substrate, wherein the first auxiliary electrode is located in a first partial region in the first non-light-emitting region, wherein the first light-emitting region includes a first light-emitting element including a first electrode, a light-emitting layer and a second electrode, and the first auxiliary electrode is arranged in the row direction or the column direction; the scan driving circuit includes a plurality of scan driving sub-circuits located in a second partial region in the first non-light-emitting region and arranged between the substrate and the first electrode; an orthographic projection of the first partial region in the first non-light-emitting region on the substrate overlaps an orthographic projection of the second partial region in the first non-light-emitting region on the substrate, and the first auxiliary electrode is electrically connected to the second electrode.

In some embodiments, the first auxiliary electrode is located in the same layer as the first electrode.

In some embodiments, the first light-emitting element is prepared by: evaporating a metal layer stack including indium tin oxide layer, aluminum layer and indium tin oxide layer; etching the metal layer stack based on a patterned mask, wherein an etching rate of the indium tin oxide layer is less than that of the aluminum layer; evaporating a light-emitting layer; and forming a second electrode layer by sputtering, so that the second electrode is in contact with the aluminum layer and the indium tin oxide layer close to the substrate in the metal layer stack.

Advantages of additional aspects of the present disclosure will be partially given in the following description, and some may become apparent from the following description or may be understood through the practice of the present disclosure.

BRIEF DESCRIPTION OF THE DRAWINGS

In order to explain the technical solutions in the embodiments of the present disclosure, the drawings of the embodiments will be briefly introduced below. It should be noted that the drawings in the following description are only some embodiments of the present disclosure, and are not intended to limit the present disclosure.

FIG. 18 shows a schematic structural diagram of a display panel provided by the embodiments of the present disclosure.

FIG. 19 shows a flowchart of a method of manufacturing a display substrate according to the embodiments of the present disclosure.

DETAILED DESCRIPTION OF EMBODIMENTS

Figure 1:
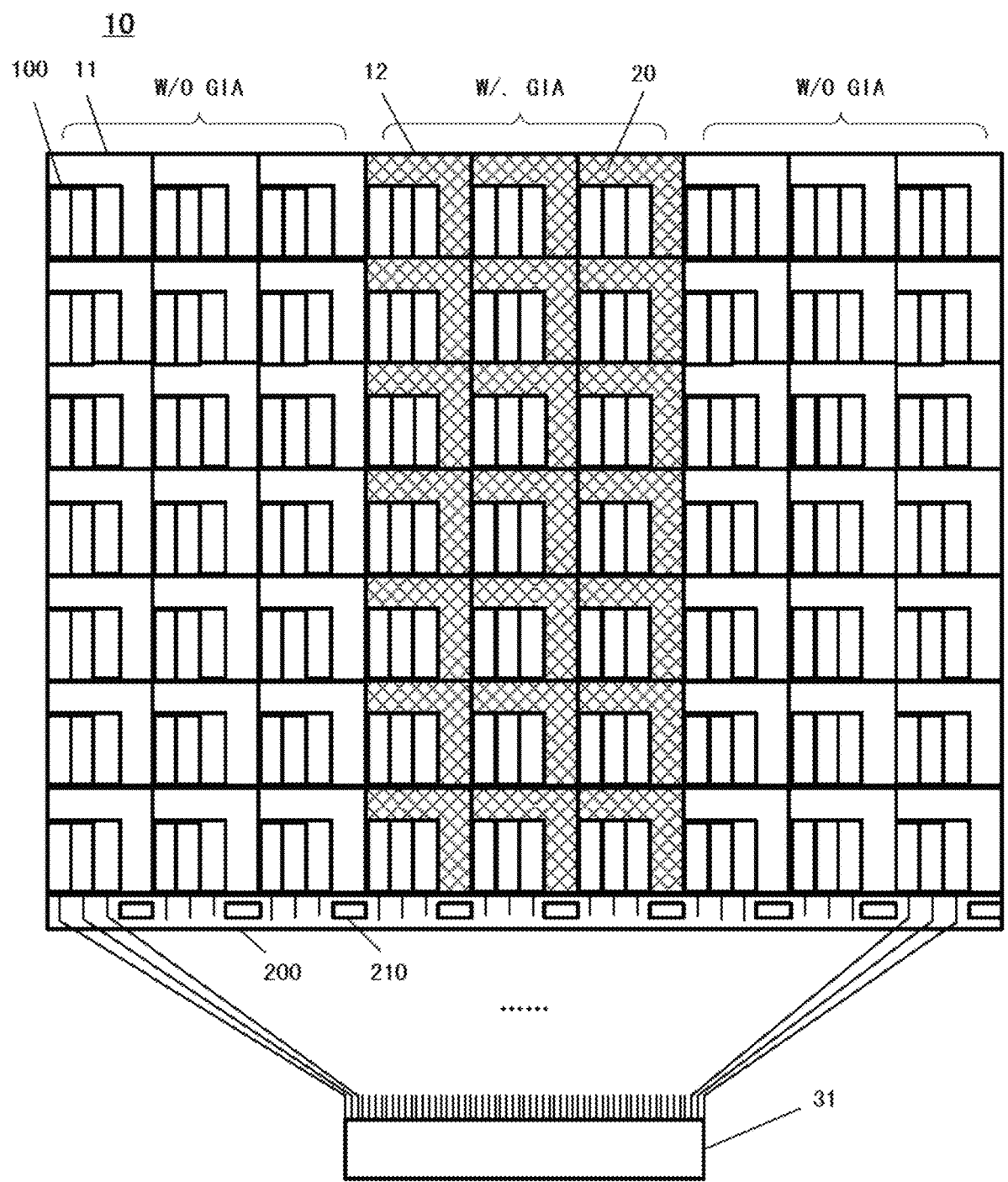
FIG. 1 shows a plan view of a display substrate.

In order to make the objectives, technical solutions and advantages of the present disclosure more apparent, the embodiments of the present disclosure will be described below with reference to the drawings. It should be understood that the following description of the embodiments is intended to explain and illustrate a general idea of the present disclosure, and should not be construed as limiting the present disclosure. In the description and the drawings, the same or similar reference numerals indicate the same or similar components or members. For clarity, the drawings are not necessarily drawn in proportion, and some known components and structures may be omitted in the drawings.

Unless otherwise defined, technical terms or scientific terms used in the present disclosure shall be of the general meaning understood by the ordinary skilled in the art. It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure. The words "connected," "coupled" or the like are not limited to a physical or mechanical connection, but may include an electrical connection, whether direct or indirect. The words "upper", "lower", "left", "right", "top" or "bottom" and the like are only used to indicate relative positional relationship, and when the absolute position of the object described is changed, the relative positional relationship may also be changed accordingly. When an element such as a layer, a film, an area or a substrate is referred to be located "above" or "below" another element, the element may be "directly" located "above" or "below" the other element, or there may be an intermediate element.

It should be noted that the expression "same layer" used herein refers to a layer structure formed by first using the same film forming process to form a film layer for forming a specific pattern, and then using the same mask to pattern the film layer by using one-time patterning process. Depending on the specific patterns, the one-time patterning process may include multiple exposure, development or etching processes, and the specific pattern in the layer structure formed may be continuous or discontinuous. That is to say, a plurality of elements, components, structures and/or parts located in the "same layer" are made of the same material and formed by the same patterning process. Generally, a plurality of elements, components, structures and/or parts located in the "same layer" have roughly the same thickness.

In order to facilitate the understanding of the technical solutions of the present disclosure, a display device, a problem existing in the display substrate, and a cause of the problem will be described firstly.

OLED display technology has gradually been widely used and has become the most potential display technology to replace LCD display. Compared with LCD display, OLED display technology has a better experience, such as advantages in picture quality, response speed, lightness and so on. However, from a technical point of view, a preparation process of OLED is much more complicated than that of LCD. In particular, a circuit of OLED panel is complicated. As a result, various corresponding OLED technologies for different application scenarios may not be unified. For example, it is necessary to address IR Rise of a cathode of a large-size top-emitting OLED. For another example, OLED is a current-type light-emitting device, which requires a power supply to make the pixel self-luminous, but a design of a power supply line often needs to occupy a large border region, which results in a poor appearance.

The embodiments of the present disclosure provide a technical solution for achieving a narrower border based on a GIA technology and solving a problem of a poor display effect caused by a large cathode IR Rise. GIA is to provide a gate driving circuit in a display region, which may achieve narrowed left and right borders of a display screen by not occupying the border.

The GIA design may compress a certain pixel space (a row direction and a column direction) for providing a GIA circuit. The GIA circuit does not use a film layer after a film layer where the source and/or drain electrode is located, for example, a pixel defining layer (PLN), an anode, and a planarization layer (PDL) are not used. An entire display region may be divided into two types of pixel units, one is a pixel unit provided with a GIA circuit, and the other type is a pixel unit without a GIA circuit.

FIG. 1 shows a plan view of a display substrate.

As shown in FIG. 1, a display substrate 10 may be an array substrate for an OLED display panel.

Referring to FIG. 1, the display substrate 10 may include a display region (e.g., a region where a plurality of pixel units are located) and a non-display region (e.g., a region where a cathode bus 200 is located). The display substrate 10 in FIG. 1 may further include a driving circuit 31 and the like located in the non-display region. For example, the driving circuit 31 may be located on at least one side of the display region. In the embodiments shown in FIG. 1, the driving circuit 31 is located on a lower side of the display region. The "lower side" may be a lower side of the display panel (screen) viewed by human eyes during display. The driving circuit 31 may be used to drive various pixels in the display substrate 10 for display. For example, the driving circuit 31 may include a data driving circuit. The data driving circuit is used to sequentially latch input data according to a timing of a clock signal and convert the latched data into an analog signal and then input the analog signal to various data lines of the display substrate 10. It should be noted that the display substrate 10 may further include a gate driving circuit, which is generally implemented by a shift register. The shift register converts the clock signal into an on/off voltage, which is then output to various gate lines of the display substrate 10.

It should be noted that although FIG. 1 shows that the driving circuit 31 is located on the lower side of the display region, the embodiments of the present disclosure are not limited thereto. The driving circuit 31 may be located at any suitable position in the non-display region.

For example, a gate driving circuit in an active array area (Gate Driver Integrate Array, GIA for short) may be further provided in the display region. Specifically, the display region may include a GIA display region (W/. GIA) and a non-GIA display region (W/O GIA). The GIA display region may include a plurality of first pixel units 12 provided with GIA. The non-GIA display region may include a plurality of second pixel units 11 without GIA. The gate driving circuit 20 is directly arranged in the first display unit 12 on the array substrate to replace an external driving chip. Each column of gate driving circuit 20 may act as a stage of shift register, and each stage of shift register is connected to a gate line. Each stage of shift register outputs a turn-on voltage in turn, so that a progressive scanning of pixels is achieved. In some embodiments, each stage of shift register may also be connected to a plurality of gate lines. In this way, it may adapt to a development trend of high resolution and narrow border of the display substrate.

In the display substrate 10 shown in FIG. 1, each pixel unit may include a light-emitting region 100 and a non-light-emitting region. The light-emitting region 100 may include a plurality of pixels. For example, a pixel unit may include a red pixel, a blue pixel and a green pixel. Each pixel is fan out to the driving circuit 31 through a signal line, so that a driving signal is supplied to each pixel. The signal line may include but is not limited to a scan line, a data line, an ELVDD power line, an ELVSS power line and so on, so that various signals such as a control signal, a data signal and a power supply voltage may be provided to the pixel driving circuit in each sub-pixel.

Each pixel may include an anode, a light-emitting element and a cathode. The cathode may be a transparent conductive electrode covering at least part of the display substrate 10. In order to supply power to the cathode, an electrical connection between the cathode and a cathode bus 200 may be made, and the cathode may be connected to the cathode bus 200 through a cathode connect hole in active array area (VSS Connect Hole Integrate Array) 210. Since the cathode bus 200 needs to be electrically connected to the cathode through the cathode connect hole 210, the non-display region (such as the border) needs to occupy a large border.

In the display substrate provided by the embodiments of the present disclosure, referring to FIG. 1, for the first pixel unit 12 with the GIA circuit, an auxiliary cathode may be fabricated in an anode layer in a region extending in the row direction in the non-light-emitting region, and then the auxiliary cathode may be connected to the cathode through an opening in the pixel defining layer (PDL).

For the second pixel unit 11 without the GIA circuit, an auxiliary cathode may also be fabricated in the anode layer in the region extending in the row direction in the non-light-emitting region, and then the auxiliary cathode may be connected to the cathode through the opening in the pixel defining layer (PDL). An auxiliary cathode may be fabricated in a metal layer of the source and/or drain electrode in a region extending in the column direction in the non-light-emitting region, and a via hole may be designed at an overlap with the auxiliary electrode in the region extending in the row direction, so as to achieve a connection with the auxiliary cathode in the row direction.

In the display region of the display substrate 10 in the embodiments of the present disclosure, at least one auxiliary cathode (for example, arranged in the anode layer and located in the row extension direction of the non-light-emitting region) is connected to the cathode either in the pixel unit without GIA or the pixel unit with GIA. In addition, the pixel unit without GIA is further provided with the auxiliary cathode extending in the column direction, which is arranged in the layer of the source and/or drain electrode. All auxiliary cathodes extending in the row direction and all auxiliary cathodes extending in the column direction in the display region are connected through a via hole. Therefore, it is only needed to connect the cathode bus located outside the display region to the auxiliary cathode, for example, connect the cathode bus located below the display substrate 10 to the auxiliary cathode extending in the column direction. A peripheral cathode bus does not need to be connected to the cathode through the connect hole. Compared with a traditional design of additionally providing a contact hole with the cathode in the cathode bus, some borders may be reduced.

The display substrate is exemplarily described below with reference to FIG. 2 to FIG. 17.

In some embodiments, the display substrate 10 may include a substrate, a pixel unit, a first light-emitting element, a scan driving circuit, and a first auxiliary electrode 30.

A plurality of pixel units are arranged on the substrate in an array in the row direction and the column direction. The plurality of pixel units include at least a first pixel unit 12 including a first light-emitting region 121 and a first non-light-emitting region. For example, the substrate may be prepared from various transparent materials, such as a glass substrate, an organic transparent substrate, and the like.

The first light-emitting element is arranged in the first light-emitting region 121 and includes a first electrode 1211 (e.g., an anode), a light-emitting layer 141 and a second electrode (e.g., a cathode). The light-emitting layer 141 may be an organic light-emitting layer or an inorganic light-emitting layer. The light-emitting layer 141 emits light after being injected with current.

The scan driving circuit is arranged in the first non-light-emitting region and may include a plurality of thin film transistors.

The first auxiliary electrode 30 is arranged on a side of the scan driving circuit away from the substrate and is located in a first partial region in the first non-light-emitting region.

Specifically, the first auxiliary electrode 30 is arranged in the row direction or the column direction. The scan driving circuit includes a plurality of scan driving sub-circuits 20 located in a second partial region in the first non-light-emitting region. An orthographic projection of the first partial region in the first non-light-emitting region on the substrate overlaps an orthographic projection of the second partial region in the first non-light-emitting region on the substrate, and the first auxiliary electrode 30 is electrically connected to the second electrode. For example, the first auxiliary electrode 30 is located in the same layer as the first electrode 1211.

Figure 2:
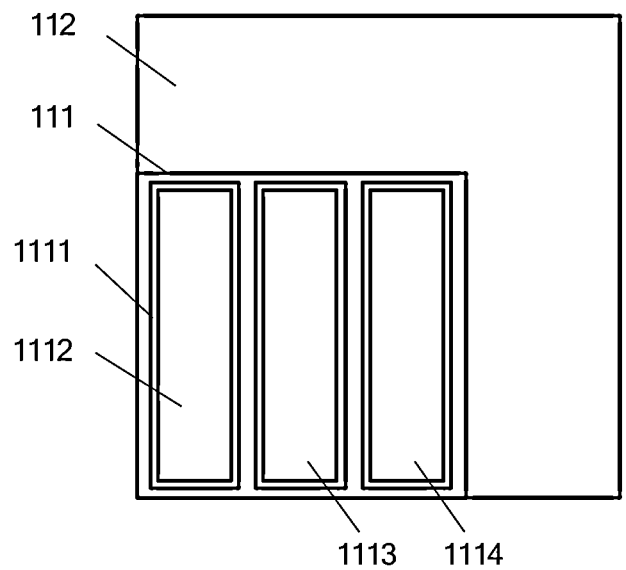
FIG. 2 shows a schematic diagram of a pixel unit provided by the embodiments of the present disclosure.

FIG. 2 shows a schematic diagram of a pixel unit provided by the embodiments of the present disclosure.

As shown in FIG. 2, the pixel unit may include a light-emitting region 111 and a non-light-emitting region 112. A plurality of sub-pixels may be provided in the light-emitting region 111. For example, the light-emitting region 111 may include a red sub-pixel 1112, a green sub-pixel 1113 and a blue sub-pixel 1114. A luminous color of the light-emitting region may be adjusted by adjusting respective luminous intensities of the red sub-pixel 1112, the green sub-pixel 1113 and the blue sub-pixel 1114. For example, if the red sub-pixel 1112 and the green sub-pixel 1113 emit light, and the blue sub-pixel 1114 does not emit light, the pixel unit may emit yellow light. The red sub-pixel 1112, the green sub-pixel 1113 and the blue sub-pixel 1114 may respectively have multiple levels of luminous intensities to mix light of multiple colors.

Each sub-pixel may have an anode 1111, a light-emitting element and a cathode. For a top-emitting OLED, each sub-pixel may correspond to an anode, and a plurality of sub-pixels may share a cathode. The light-emitting elements of various sub-pixels may emit light of the same color, or may emit light of different colors respectively. For example, the light-emitting element of the red sub-pixel 1112 emits red light, the light-emitting element of the green sub-pixel 1113 emits green light, and the light-emitting element of the blue sub-pixel 1114 emits blue light. For example, the light-emitting elements of the red sub-pixel 1112, the green sub-pixel 1113 and the blue sub-pixel 1114 all emit white light, and then the white light emitted by the light-emitting elements is filtered by a red color filter, a green color filter and a blue color filter, respectively, so as to obtain red light, green light and blue light.

It should be further noted that an orthographic projection of the sub-pixel on the base substrate may be a rounded rectangle, but the embodiments of the present disclosure are not limited thereto. For example, the orthographic projection of the sub-pixel on the base substrate may have other shapes, such as a rectangle, a hexagon, a pentagon, a square, or a circle.

Figure 3:
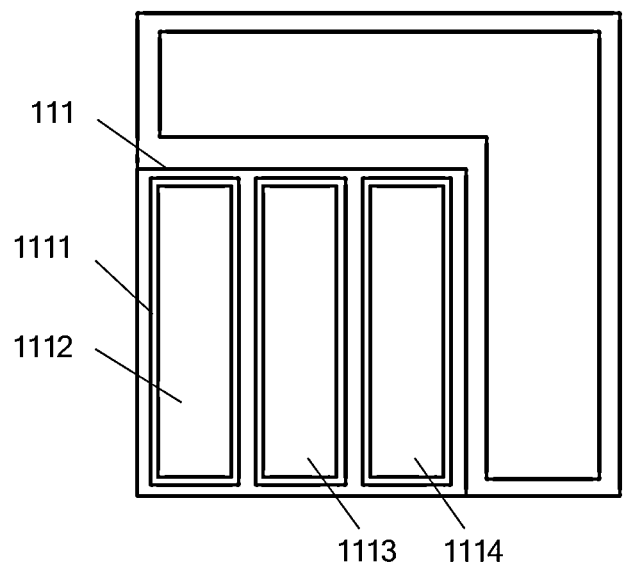
FIG. 3 shows a schematic diagram of a non-light-emitting region compressed from a pixel unit provided by the embodiments of the present disclosure.

FIG. 3 shows a schematic diagram of a non-light-emitting region compressed from a pixel unit provided by the embodiments of the present disclosure.

As shown in FIG. 3, in order to reduce an edge region of the display substrate 10 occupied by the scan driving circuit, a design style of each sub-pixel in the pixel unit may be changed so that the pixel unit includes the non-light-emitting region 112. In this way, a circuit, such as a driving circuit, an auxiliary circuit, etc., may be provided in the non-light-emitting region 112. The provided circuit may occupy all of the non-light-emitting region 112 or occupy a part of the non-light-emitting region 112.

In some embodiments, the non-light-emitting region 112 is an L-shaped region. In addition, the non-light-emitting region 112 may also be an I-shaped region, a concave region, a crescent-shaped region, a square region, etc., which are not limited herein.

Figure 4:
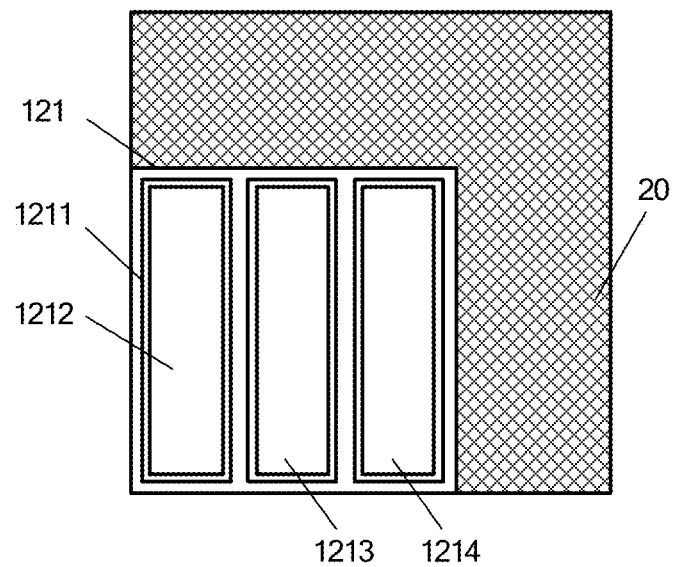
FIG. 4 shows a schematic diagram of a first pixel unit with GIA provided by the embodiments of the present disclosure.

FIG. 4 shows a schematic diagram of a first pixel unit with GIA provided by the embodiments of the present disclosure.

As shown in FIG. 4, the scan driving sub-circuits 20 may be distributed in the entire non-light-emitting region. Specifically, the scan driving sub-circuit 20 may be a gate driving circuit. The gate driving circuit is generally implemented by a shift register. The shift register converts a clock signal into an on/off voltage, which is then output to each gate line of the display substrate 10. The first pixel unit 12 may include a first light-emitting region 121 and a first non-light-emitting region. The first light-emitting-region 121 may include a plurality of sub-pixels. For example, the first light-emitting-region 121 may include a red sub-pixel 1212, a green sub-pixel 1213 and a blue sub-pixel 1214. Each sub-pixel may have an anode 1211, a light-emitting element and a cathode. For a top-emitting OLED, each sub-pixel may correspond to an anode, and a plurality of sub-pixels may share a cathode.

Figure 5:
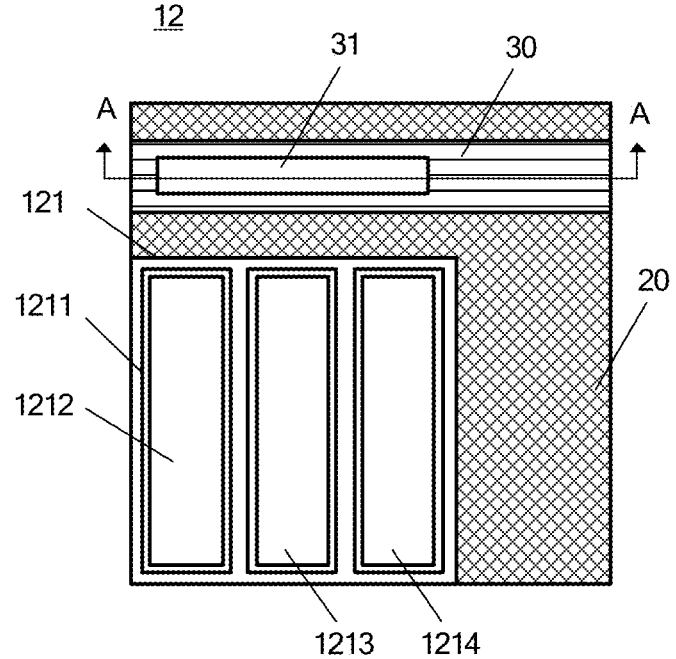
FIG. 5 shows a schematic diagram of a first auxiliary electrode provided by the embodiments of the present disclosure.

FIG. 5 shows a schematic diagram of a first auxiliary electrode provided by the embodiments of the present disclosure.

As shown in FIG. 5, the first auxiliary electrode 30 is located in a first partial region in the first non-light-emitting region, and the first partial region may be a region extending in the row direction in the first non-light-emitting region. The first auxiliary electrode 30 may be electrically connected to the cathode located in an upper layer through a via hole. A material of the first auxiliary electrode 30 may be the same as that of the first electrode 1211.

The first electrode 1211 may be a reflective anode, for example, which may be formed of a metal material. The metal material may include an alloy such as magnesium aluminum alloy (MgAl), lithium aluminum alloy (LiAl), or a single metal such as magnesium, aluminum, lithium, etc. For example, the first electrode 1211 may be a single-layer metal structure, such as a single-layer silver (Ag) metal electrode. The first electrode 1211 may be a multi-layer metal electrode, such as a stack of indium tin oxide (ITO)/silver (Ag)/indium tin oxide (ITO), a stack of titanium (Ti)/silver (Al)/titanium (Ti), etc.

For a medium and large-size top-emitting OLED, the cathode is a high-impedance transparent cathode having a large voltage rise (VSS IR Rise), that is, a cathode voltage value difference between a near end and a far end of Power In is quite large. In the embodiments of the present disclosure, a low-resistance material is provided in parallel to the transparent electrode, so as to reduce an impedance of a cathode current path, that is, the auxiliary cathode is added.

It should be noted that a blank region of the pixel region without GIA circuit may also be kept blank when the auxiliary cathode is not provided. Alternatively, in order to keep a consistent uniformity throughout the display substrate 10, some dummy patterns may be designed.

In some embodiments, the light-emitting layer 141 includes an organic light emitting diode. The first electrode 1211 and the third electrode 1111 are an anode of the organic light emitting diode, and the second electrode and the fourth electrode are a cathode of the organic light emitting diode. The scan driving circuit includes a gate driving circuit.

The light-emitting layer 141 may have a multi-layer structure, for example, it may include a multi-layer structure formed by a hole injection layer, a hole transport layer, an organic light emitting layer, an electron transport layer and an electron injection layer.

The second electrode may directly cover the entire display substrate 10, for example, the second electrode may be prepared by means of evaporation, sputtering, or the like. The second electrode may be a transparent electrode so that the light emitted by the OLED may be emitted from the top of the display substrate 10 instead of being totally absorbed or totally reflected by the second electrode. For example, the second electrode includes, but is not limited to at least one of ITO, indium zinc tin oxide ITZO, indium zinc oxide (IZO), nano-silver layer, and the like.

In some embodiments, the first auxiliary electrode 30 may be isolated from the second electrode by a dielectric layer. The electrical connection between the first auxiliary electrode 30 and the second electrode may be made by opening a hole in the dielectric layer. The dielectric layer includes, but is not limited to at least one of a pixel defining layer, an insulating layer, a planarization layer, and the like.

It should be noted that the OLED device may be implemented using active drive or passive drive. A passive drive OLED array substrate includes a cathode and an anode, an intersection of the anode and the cathode may emit light, and the driving circuit may be externally mounted by a tape carrier package, a chip-on-glass or other connection methods. An active drive OLED array substrate may provide each pixel with a pixel driving circuit including a thin film transistor with a switching function (that is, a switching transistor), a thin film transistor with a driving function (that is, a driving transistor) and a charge storage capacitor. In addition, the pixel driving circuit may further include other types of thin film transistor with a compensation function. It should be understood that, in the embodiments of the present disclosure, the display panel may be equipped with various types of known pixel driving circuits, which will not be described in detail here.

Figure 6:
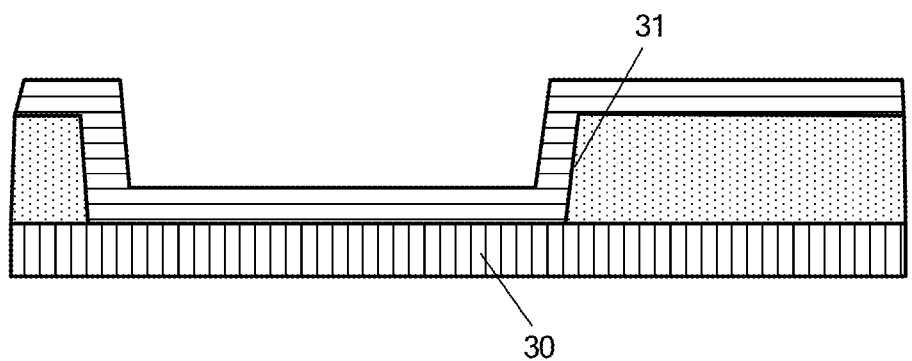
FIG. 6 shows a schematic cross-sectional view taken along line A-A in FIG. 5.

FIG. 6 shows a schematic cross-sectional view taken along line A-A in FIG. 5.

As shown in FIG. 6, one or more dielectric layers or the like exist between the first auxiliary electrode 30 and the second electrode to electrically insulate the first auxiliary electrode 30 and the second electrode located in different layers. An opening 31 may be formed in the dielectric layer by photolithography, etching or other processes, so as to achieve an electrical connection between the first auxiliary electrode 30 and the second electrode located in different layers. For example, a dielectric layer may be formed after the first auxiliary electrode 30 is formed, then the opening 31 is formed in the dielectric layer through photolithography, etching or other processes to expose the first auxiliary electrode 30, and then the second electrode is formed so that the second electrode at the opening is electrically connected to the exposed first auxiliary electrode 30. It should be noted that in FIG. 6, other structures such as a GIA circuit, a source and/or drain electrode, a data line, etc. may be provided under the first auxiliary electrode 30.

In some embodiments, the plurality of pixel units further include the second pixel unit 11 including a second light-emitting region 121 and a second non-light-emitting region, and no scan driving circuit is provided in the second non-light-emitting region. Specifically, the second pixel unit 11 may refer to the plurality of pixel units included in the W/O GIA region in FIG. 1, and no scan driving circuit is provided in these pixel units.

In some embodiments, the display substrate 10 may further include a second light-emitting element and a second auxiliary electrode 40.

The second light-emitting element is arranged in the second light-emitting region, and the second light-emitting element includes a third electrode 1111, a light-emitting layer 141 and a fourth electrode. The third electrode 1111 may be located in the same layer as the first electrode 1211. An arrangement of the first electrode 1211 in the first light-emitting element may be the same as that of the third electrode 1111 in the second light-emitting element. A material of the third electrode 1111 may be the same as that of the first electrode 1211. The third electrode 1111 may be fabricated in the same process as the first electrode 1211.

The second auxiliary electrode 40 may be located in a first partial region of the second non-light-emitting region. The first partial region in the second non-light emitting region may be a region extending in the row direction in the second non-light-emitting region.

The second auxiliary electrode 40 may be located in the same layer as the third electrode 1111, the third electrode 1111 may be located in the same layer as the first electrode 1211, and the second auxiliary electrode 40 may be arranged in parallel to the first auxiliary electrode 30. For example, the second auxiliary electrode 40 may be arranged in the row direction, and the second auxiliary electrode 40 is electrically connected to the fourth electrode. The first auxiliary electrode 30, the second auxiliary electrode 40, the first electrode 1211 and the third electrode 1111 may be formed through the same thin film process, photolithography process and etching process.

Figure 7:
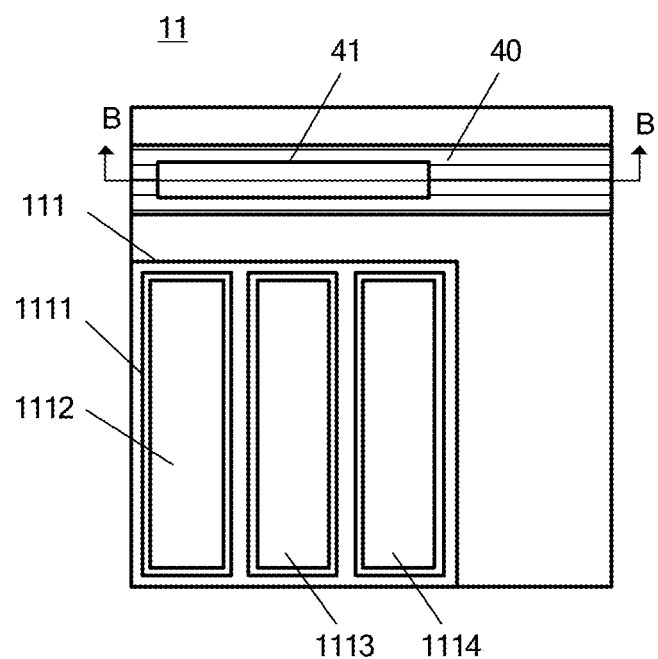
FIG. 7 shows a schematic diagram of a second auxiliary electrode provided by the embodiments of the present disclosure.

FIG. 7 shows a schematic diagram of a second auxiliary electrode provided by the embodiments of the present disclosure.

A schematic cross-sectional view of the structure in FIG. 7 taken along line B-B may refer to FIG. 6. For example, the first auxiliary electrode 30 may be replaced with the second auxiliary electrode 40, and the via hole 31 may be replaced with a via hole 41, which will not be described in detail here. It should be noted that other structures such as a dummy pattern, a source and/or drain electrode, a data line, etc. may be provided under the second auxiliary electrode 40.

In addition, the second pixel unit 11 shown in FIG. 7 may further include a second light-emitting region 111 and a second non-light-emitting region. The second light-emitting region 111 may include a plurality of sub-pixels, such as a red sub-pixel 1112, a green sub-pixel 1113 and a blue sub-pixel 1114. Each sub-pixel may have an anode 1111, a light-emitting element and a shared cathode. The anode of each sub-pixel in the first pixel unit 12 and the anode of each sub-pixel in the second pixel unit 11 may be fabricated in the same process.

In some embodiments, the display substrate 10 may further include a source and/or drain electrode and a third auxiliary electrode 50.

The source and/or drain electrode is arranged on a side of the layer of the third electrode 1111 close to the substrate and is located in the second non-light-emitting region. A metal layer where the source and/or drain electrode is located may also be referred to as an SD layer, which may be used to fabricate the source and/or drain electrode as well as the third auxiliary electrode 50 and the data line, etc.

The third auxiliary electrode 50 is located in a second partial region in the second non-light emitting region.

Figure 8:
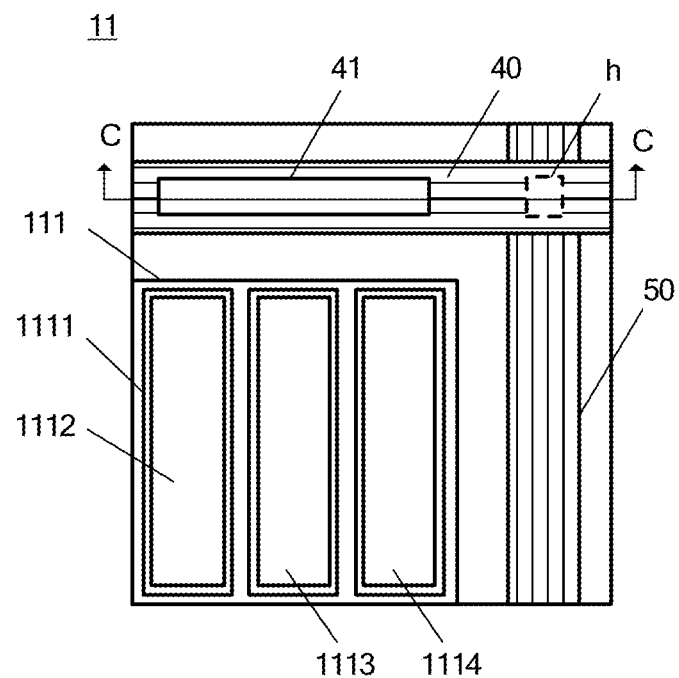
FIG. 8 shows a schematic diagram of a second auxiliary electrode and a third auxiliary electrode provided by the embodiments of the present disclosure.

FIG. 8 shows a schematic diagram of the second auxiliary electrode and the third auxiliary electrode provided by the embodiments of the present disclosure.

Figure 9:
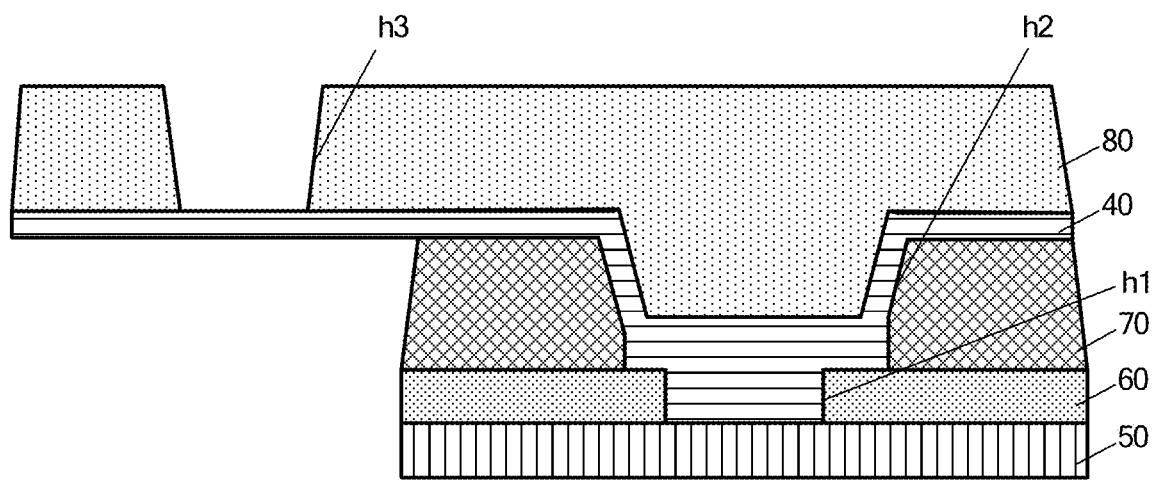
FIG. 9 shows a schematic cross-sectional view taken along line C-C in FIG. 8.
Figure 10:
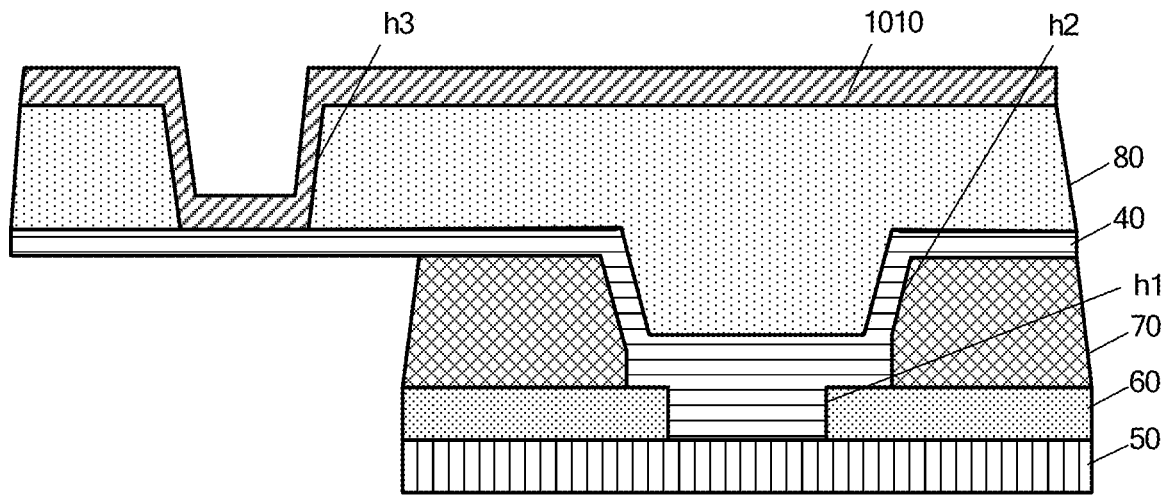
FIG. 10 shows another schematic cross-sectional view taken along line C-C in FIG. 8.

As shown in FIG. 8, compared with FIG. 7, FIG. 8 further includes a third auxiliary electrode 50 and a via hole h for an electrical connection between the second auxiliary electrode 40 and the third auxiliary electrode 50. FIG. 9 shows a schematic cross-sectional view taken along line C-C in FIG. 8. FIG. 10 shows another schematic cross-sectional view taken along line C-C in FIG. 8.

In FIG. 8, an orthographic projection of an extension direction of the third auxiliary electrode 50 on the base substrate is in contact with an orthographic projection of an extension direction of the second auxiliary electrode 40 on the substrate, and an orthographic projection of the source and/or drain electrode on the base substrate is spaced apart from an orthographic projection of the second partial region in the second non-light-emitting region on the substrate. The third auxiliary electrode 50 is arranged in the same layer as the source and/or drain electrode to avoid a short circuit between the source and/or drain electrode and the third auxiliary electrode 50. For example, the source and/or drain electrode may be located in the second light-emitting region.

The third auxiliary electrode 50 is electrically connected to the second auxiliary electrode 40. The second auxiliary electrode 40 is electrically connected to the fourth electrode, so that the third auxiliary electrode 50 is electrically connected to the fourth electrode.

As shown in FIG. 9, the second auxiliary electrode 40 may be connected to the third auxiliary electrode 50 through the second via hole h2 and the first via hole h1.

In some embodiments, the display substrate 10 may further include a planarization layer 60 and an insulating layer 70.

The planarization layer 60 and the insulating layer 70 are stacked and arranged together between the second auxiliary electrode 40 and the third auxiliary electrode 50. The planarization layer 60 includes a first via hole h1, and the insulating layer 70 includes a second via hole h1. An orthographic projection of the first via hole h1 on the substrate overlaps an orthographic projection of the second via hole h2 on the substrate. Accordingly, the third auxiliary electrode 50 is electrically connected to the second auxiliary electrode 40 through the first via hole h1 and the second via hole h2.

In some embodiments, the first via hole h1 and the second via hole h2 are polygonal via holes, and a diameter of the second via hole h2 is greater than that of the first via hole h1. Alternatively, the first via hole h1 and the second via hole h2 are polygonal via holes, and an area of the second via hole h2 is greater than that of the first via hole h1. This helps to improve a process window. Even in a case of a certain error or deviation in the alignment, a contact area between the second auxiliary electrode 40 and the third auxiliary electrode 50 may be made not less than the area of the first via hole h1 as much as possible, so that a contact resistance between the second auxiliary electrode 40 and the third auxiliary electrode 50 is sufficiently small.

In some embodiments, the display substrate 10 may further include a pixel defining layer 80. The anode of the first light-emitting element and/or the second light-emitting element is at least partially exposed by the opening of the pixel defining layer 80. For example, an orthographic projection of the pixel defining layer 80 on the substrate covers the first non-light-emitting region. For another example, the orthographic projection of the pixel defining layer 80 on the substrate covers the second non-light-emitting region.

For example, the pixel defining layer 80 is arranged between the second electrode and the first auxiliary electrode 30. The pixel defining layer 80 includes a third via hole h3, and the first auxiliary electrode 30 is electrically connected to the second electrode through the third via hole h3.

For another example, the pixel defining layer 80 is arranged between the fourth electrode 1010 and the second auxiliary electrode 40. The pixel defining layer 80 includes a third via hole h3, and the second auxiliary electrode 40 is electrically connected to the fourth electrode through the third via hole h3.

As shown in FIG. 10, the display substrate 10 further includes the pixel defining layer 80 and the fourth electrode 1010 covering the pixel defining layer 80. The fourth electrode 1010 is electrically connected to the second auxiliary electrode 40 through the third via hole h3. For example, the fourth electrode may be formed by evaporation, sputtering or other processes after the patterned pixel defining layer 80 is formed.

In some embodiments, the first via hole h1 is a polygonal via hole, the third via hole h3 is a strip via hole, and a size of the strip via hole in the row direction is greater than the diameter of the first via hole h1. By increasing the size of the strip via hole in the row direction, a contact area between the cathode and the first auxiliary electrode 30 and/or between the cathode and the second auxiliary electrode 40 may be effectively increased, and the contact resistance may be reduced.

In some embodiments, the orthographic projection of the first via hole h1 on the substrate is spaced apart from the orthographic projection of the third via hole h3 on the substrate. This avoids forming a via hole with an excessively large depth on the display substrate 10 and resulting in a thin cathode on a sidewall of the via hole that, on the one hand, may easily increase the resistance of the cathode at the sidewall of the via hole, and on the other hand, may cause a breakpoint, which may result in a failure or a poor aging performance. By arranging the first via hole h1 and the third via hole h3 at different positions, the depth of a single via hole is effectively reduced, and a reliability and the aging performance are improved without increasing the resistance of the cathode.

In the embodiments of the present disclosure, the first auxiliary electrode 30 is located in the non-light-emitting region, arranged in the same layer as the first electrode 1211, and isolated from the first electrode 1211. In this way, the first auxiliary electrode 30 may be fabricated simultaneously with the first electrode 1211, and no additional film layer is required. The second auxiliary electrode 40 is located in the non-light-emitting region, arranged in the same layer as the third electrode 1111, and isolated from the third electrode 1111, so that the second auxiliary electrode 40 may be fabricated simultaneously with the third electrode 1111, and no additional film layer is required. The third auxiliary electrode 50 is located in the non-light-emitting region, arranged in the same layer as the source and/or drain electrode, and isolated from the second electrode, so that the third auxiliary electrode 50 may be fabricated simultaneously with the source and/or drain electrode, and no additional film layer is required. The electrical connection between the transparent cathode, the first auxiliary electrode 30, the second auxiliary electrode 40 and the third auxiliary electrode 50 may further reduce the impedance of the transparent cathode, so as to reduce the voltage drop more effectively and further improve a display effect.

In some embodiments, one second auxiliary electrode 40 corresponds to one or more rows of second pixel units 11, and/or one third auxiliary electrode 50 corresponds to one or more columns of second pixel units 11.

Either a design density of the auxiliary cathode extending in the column direction in the layer of the source and/or drain electrode or a design density of the auxiliary cathode extending in the row direction and located in the anode layer may be 1:1 or 1:N with that of the pixel, that is, multiple rows or multiple columns of pixels are designed with one auxiliary cathode, where N is a positive integer greater than 1.

Specifically, a row of second pixel units 11 exclusively shares a second auxiliary electrode 40 arranged in the row direction, or a plurality of rows of second pixel units 11 collectively correspond to a second auxiliary electrode 40 arranged in the row direction. An arrangement of the second pixel unit 11 and the third auxiliary electrode 50 is similar to that of the second pixel unit 11 and the second auxiliary electrode 40. In some embodiments, a first auxiliary electrode 30 corresponds to one or more rows of first pixel units 12.

For example, a scan driving sub-circuit may correspond to a row of pixel units or a column of pixel units. In this case, a signal output by a scan driving sub-circuit may be used as a scan signal for the row of pixel units or the column of pixel units corresponding to the scan driving sub-circuit. For example, two-row driving or four-row driving may be adopted, that is, the output signal of one scan driving sub-circuit may be used to drive two or four rows of pixels.

It should be noted that a distance between the plurality of first auxiliary electrodes 30, a distance between the plurality of second auxiliary electrodes 40 and a distance between the plurality of third auxiliary electrodes 50 may be determined according to an electrical conductivity of the cathode and an electrical conductivity of each auxiliary electrode. For example, a large width or thickness of the auxiliary electrode may result in an excellent electrical conductivity of the auxiliary electrode, and if the cathode also has a good electrical conductivity, then the distance between the plurality of first auxiliary electrodes 30, the distance between the plurality of second auxiliary electrodes 40 and the distance between the plurality of third auxiliary electrodes 50 may be set larger to reduce an influence of signal crosstalk. On the contrary, the distance between the plurality of first auxiliary electrodes 30, the distance between the plurality of second auxiliary electrodes 40 and the distance between the plurality of third auxiliary electrodes 50 may be set smaller to reduce the cathode resistance.

In some embodiments, if the display region has a large area, it may not be needed to provide the GIA circuit in all GIA pixel units, but only provide the GIA circuit in some GIA pixel units. For example, every three columns of pixel units may share a GIA sub-circuit. Specifically, a scan driving sub-circuit arranged in the column direction corresponds to one or more columns of first pixel units 12.

In order to supply power to the cathode, a cathode bus may be added outside the display region, and the cathode bus may be connected to the cathode after digging a hole in the cathode bus, so that a voltage may be supplied to the cathode of the light-emitting element by supplying power to the cathode bus. However, the data line drawn from the display region needs to bypass the cathode hole and extend from the cathode bus, and then a fan-out wiring may be performed. The embodiments of the present disclosure provide a solution for supplying power to the cathode without a cathode connect hole, so as to further reduce the border. Specifically, after the auxiliary cathode is drawn from the display region, the Fan-Out wiring is directly performed, and an amount of the border reduced is about a width of the cathode bus.

In some embodiments, the display substrate 10 may further include a non-display region and a second electrode bus 91 arranged in the non-display region. The second electrode bus 91 is used to transmit a reference voltage signal to the second electrode.

In some embodiments, the display substrate 10 may further include a non-display region and a fourth electrode bus 92 arranged in the non-display region. The fourth electrode bus 92 is used to transmit a reference voltage signal to the fourth electrode.

Specifically, in order to reduce a process complexity, for example, the first auxiliary electrode 30 and the second auxiliary electrode 40 are arranged in the same layer as the second electrode bus 91, the first auxiliary electrode 30 is connected to the second electrode bus 91, and the second auxiliary electrode 40 is connected to the second electrode bus 91.

Figure 11:
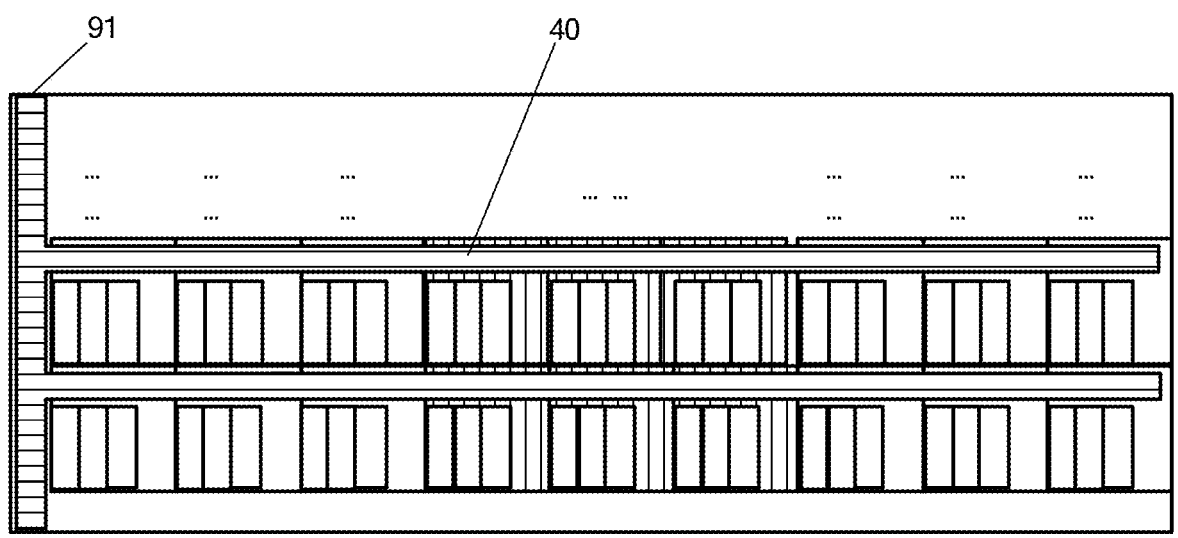
FIG. 11 shows a schematic diagram of a second electrode bus provided by the embodiments of the present disclosure.

FIG. 11 shows a schematic diagram of the second electrode bus provided by the embodiments of the present disclosure.

As shown in FIG. 11, the second electrode bus 91 may be arranged in the non-display region on a side of the display substrate 10. Since the second electrode bus 91 and the second auxiliary electrode 40 are located in the same layer, connected second electrode bus 91 and second auxiliary electrode 40 may be manufactured by means of thin film patterning, and there is no need to connect the second electrode bus 91 and the second auxiliary electrode 40 through an opening, which may simplify the process and does not need to reserve an area required for the opening, so that an occupation of the non-display region of the border may be effectively reduced, and a border width may be reduced.

Figure 12:
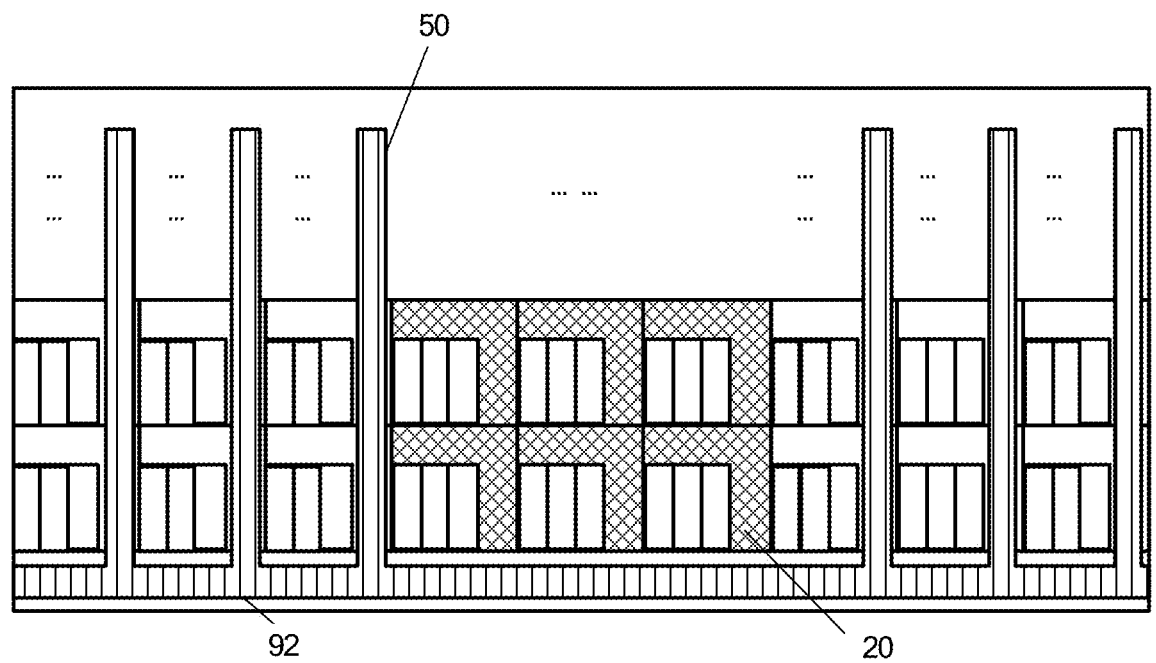
FIG. 12 shows a schematic diagram of a fourth electrode bus provided by the embodiments of the present disclosure.

FIG. 12 shows a schematic diagram of the fourth electrode bus provided by the embodiments of the present disclosure.

As shown in FIG. 12, the third auxiliary electrode 50 is arranged in the same layer as the fourth electrode bus 92, and the third auxiliary electrode 50 is connected to the fourth electrode bus 92. In FIG. 12, the fourth electrode bus 92 may be arranged in the non-display region on a side of the display substrate 10, such as at a bottom or a top of the display substrate 10. Since the fourth electrode bus 92 and the third auxiliary electrode 50 are located in the same layer, connected fourth electrode bus 92 and third auxiliary electrode 50 may be manufactured by means of thin film patterning, and it is not needed to connect the fourth electrode bus 92 and the third auxiliary electrode 50 through an opening, which may simplify the process and does not need to reserve the area required for the opening, so that the occupation of the non-display region of the border may be effectively reduced and the border width may be reduced. It should be noted that the third auxiliary cathode 50 may not be provided in the pixel unit with GIA.

Specifically, if the blank region of the pixel unit without GIA is used, an SD layer (the layer where the source and/or drain electrode is located) metal line located in the same layer as the data line may be placed in the bus blank region and connected to the cathode bus (VSS Bus Line) outside the display region. In the pixel unit (including the pixel unit with GIA and the pixel unit without GIA), the metal line of the anode layer is placed in the GIA region in the row direction and connected to the auxiliary cathode via hole located in the bus SD layer, so that a mesh connection structure for the auxiliary cathode is achieved. The way of opening the PDL on the auxiliary cathode in the anode layer in the row direction makes the auxiliary cathode in the anode layer overlap the transparent cathode. The above solution not only achieves a purpose of supplying voltage to the pixel cathode, but also arranges the auxiliary cathode in the existing space, which may effectively reduce the VSS IR Rise on the basis of achieving a narrow border.

In the embodiments of the present disclosure, the first auxiliary electrode 30 and the third auxiliary electrode 50 form a mesh structure, and the second auxiliary electrode 40 and the third auxiliary electrode 50 form a mesh structure, which may effectively reduce the voltage drop of the transparent cathode and greatly alleviate the problem of cross talk, so that the display effect may be significantly improved and the display effect of the display substrate may be improved. The display substrate 10 provided by the embodiments of the present disclosure may be provided with the first auxiliary electrode 30, the second auxiliary electrode 40 and the third auxiliary electrode 50 without adding a new film layer, which may further reduce the impedance of the transparent cathode, so that the voltage drop may be reduced more effectively and the display effect may be further improved. In addition, the embodiments of the present disclosure adopt wire layers in a back plate process without additional process layers and do not increase a complexity of the manufacturing process, so that a production efficiency is improved.

It should be noted that the second electrode bus 91 and the fourth electrode bus 92 may be provided simultaneously.

Figure 13:
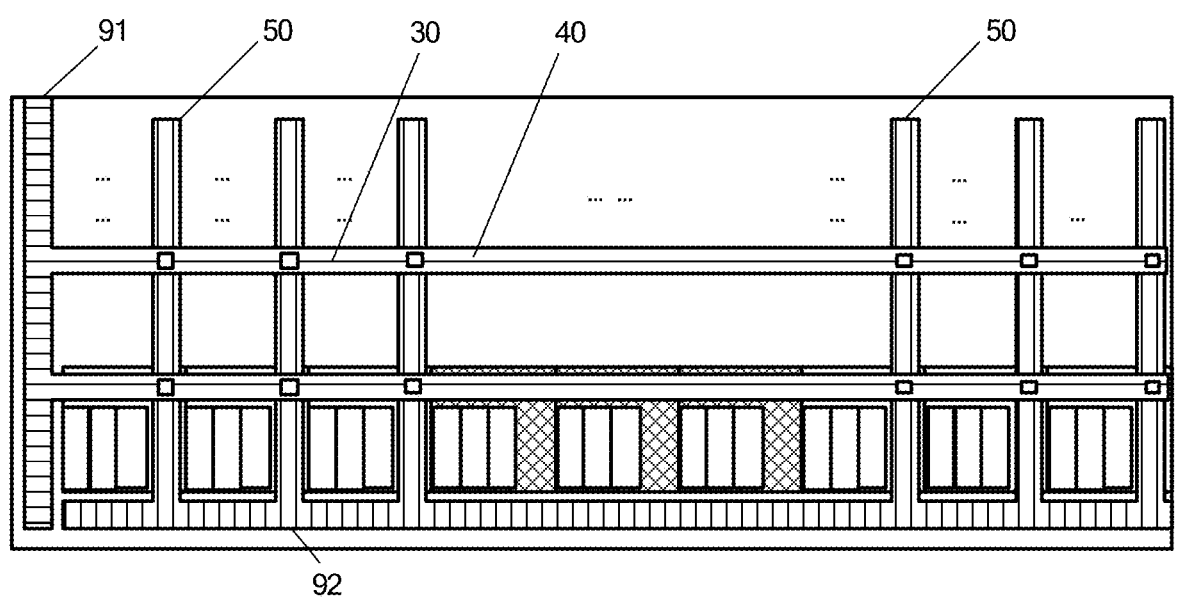
FIG. 13 shows a schematic diagram of simultaneously providing a second electrode bus and a fourth electrode bus according to the embodiments of the present disclosure.

FIG. 13 shows a schematic diagram of simultaneously providing the second electrode bus and the fourth electrode bus according to the embodiments of the present disclosure.

As shown in FIG. 13, the second electrode bus 91 may be arranged in the non-display region on a left side of the display substrate 10, and the fourth electrode bus 92 may be arranged in the non-display region at a bottom of the display substrate 10. The second electrode bus 91, the first auxiliary electrode 30 and the second auxiliary electrode 40 are formed by one patterning process for the layer of the first electrode 1211 and the third electrode 1111. The fourth electrode bus 92 and the third auxiliary electrode 50 are formed by one patterning process for the layer of the source and/or drain electrode. The third auxiliary electrode 50 may be respectively connected to the first auxiliary electrode 30 and the second auxiliary electrode 40 through via holes to further reduce the cathode resistance. Alternatively, an ability of the auxiliary electrode to reduce the cathode resistance already meets a design requirement, and the third auxiliary electrode 50 is isolated from the first auxiliary electrode 30 and the second auxiliary electrode 40.

The display substrate 10 provided by the embodiments of the present disclosure is not only applicable to a rectangular display substrate, but also applicable to a scene of a special-shaped screen.

In some embodiments, a shape of the display substrate 10 includes any one of a square, a rectangle, a polygon and a shape with an arc boundary.

For example, for a display substrate 10 with a heart-shaped boundary, a plurality of pixel units are respectively located in different display regions, and each display region has an exclusive scan driving sub-circuit.

Figure 14:
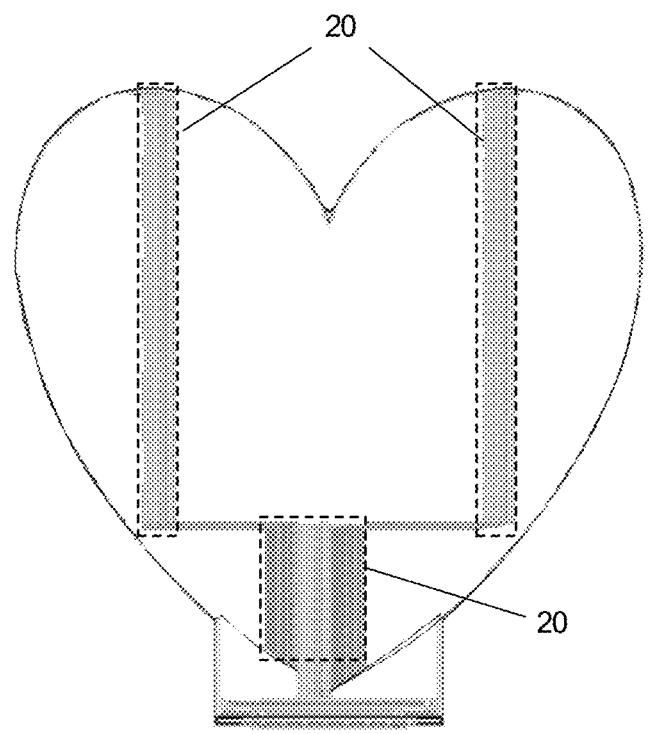
FIG. 14 shows a schematic diagram of a GIA of a heart-shaped display substrate provided by the embodiments of the present disclosure.

FIG. 14 shows a schematic diagram of a GIA of a heart-shaped display substrate provided by the embodiments of the present disclosure.

As shown in FIG. 14, taking a heart-shaped display substrate as an example, the heart-shaped display substrate may be divided into three blocks, including a tip region of the heart shape and head regions of the heart shape in a mirror image distribution. Each region has a scan driving sub-circuit 20. Specifically, a data driving circuit and the like may be arranged at the tip position of the heart shape of the heart-shaped display substrate, and the scan driving sub-circuit 20 (e.g., a gate driving circuit) may be arranged in some pixel units. A connection line of the scan driving circuit in the head region of the heart shape may be introduced from the tip region of the heart shape and connected to the scan driving sub-circuit in the head region of the heart shape.

Specifically, the display substrate with the heart-shaped boundary includes a display region at a tip of the heart shape and two symmetrical display regions at a head of the heart shape, and the scan driving sub-circuit is arranged in the column direction.

The display substrate 10 provided by the embodiments of the present disclosure is not limited to a rectangular OLED screen, and is also applicable to a special-shaped OLED screen. The dotted boxes in FIG. 14 show the GIA circuit of the special-shaped screen. Pixel units in other display regions except for these three regions may be provided with auxiliary cathodes of mesh structure. For example, a pixel unit without GIA may be provided with a third auxiliary cathode extending in the column direction and located in the same layer as the data line. Either the pixel unit with GIA or the pixel unit without GIA may be provided with an auxiliary cathode in the same layer as the anode in the row direction, and the PDL opening on the auxiliary cathode is used for connection with the cathode.

In some embodiments, a conductive layer of a gate material may be Mo or the like. A conductive layer of a source and/or drain material may be Ti/Al/Ti or the like.

Specifically, the gate material may include a metal material, such as Mo, Al, Cu, etc. and their alloys. The source and/or drain material may include a metal material, such as Mo, Al, Cu, etc. and their alloys. A semiconductor material constituting the active layer may include, for example, amorphous silicon, polysilicon, oxide semiconductor, etc., and an oxide semiconductor material may include, for example, IGZO (indium gallium zinc oxide), ZnO (zinc oxide), etc.

In some embodiments, the cathode contains a transparent conductive material, and the anode contains a metal material. The metal material may be a material with high conductivity and high reflectivity, so that when the light emitted from the light-emitting layer 141 faces the substrate, it may be reflected by the anode to the top of the pixel unit for light output, which helps to improve a light output efficiency and reduce an energy consumption.

The first electrode 1211 may include a multi-layer metal structure having a cross-section with a shape of Chinese character " 工 ".

The specific method of forming the first electrode 1211, the first auxiliary electrode 30, the second electrode, the third electrode 1111, the second auxiliary electrode 40, the third auxiliary electrode 50 and the pixel defining layer 80 is not limited and may be determined according to the actual situation. The above solution may be directly used for printed OLED or evaporated OLED of FMM (Fine Meta Mask).

For example, the first electrode 1211, the first auxiliary electrode 30, the second electrode, the third electrode 1111, the second auxiliary electrode 40, the third auxiliary electrode 50 and the pixel defining layer 80 may be formed by a printing process, that is, the display substrate 10 may be manufactured by a full printing process. The display substrate 10 manufactured by the full printing process has advantages of high service life, high PPI and less process flow.

In some embodiments, the above solution may not be used directly for a whole surface evaporated OLED (Opne Mask), but may be further improved for use. That is, some special processes may be used to achieve the connection between the first auxiliary electrode 30 and the first electrode 1211, or the connection between the second auxiliary electrode 40 and the third electrode 1111. For example, an anode layer of special film structure (such as inverted trapezoid or structure with a shape of Chinese character " 工 ") may cut off the evaporated EL layer, so that the cathode may be connected to the anode. For example, the first electrode 1211 includes a multi-layer metal structure having a cross-section with a shape of Chinese character " 工 ". In this way, after the OLED is formed, the light-emitting layer 141 is automatically cut off, and the first auxiliary electrode 30 is connected to the first electrode 1211, or the second auxiliary electrode 40 is connected to the third electrode 1111.

Figure 15:
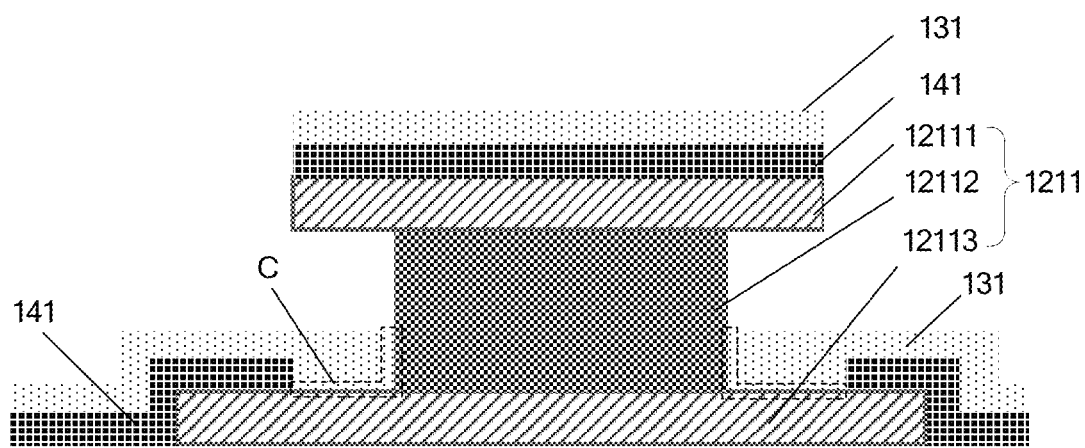
FIG. 15 shows a schematic cross-sectional view of an organic light emitting diode provided by the embodiments of the present disclosure.

FIG. 15 shows a schematic cross-sectional view of an organic light emitting diode provided by the embodiments of the present disclosure.

As shown in FIG. 15, for example, the first electrode 1211 includes a stack of indium tin oxide layer 12111, aluminum layer 12112 and indium tin oxide layer 12113. After the above-mentioned stack is formed, the first electrode 1211 may be formed by patterning, for example, a pattern of the first electrode 1211 may be formed by photolithography and etching process. Since the etching is performed from an upper surface to a lower surface, an etching time of an upper surface film is longer than that of a lower surface film. In the first electrode 1211 including three layers in FIG. 15, a size of the indium tin oxide layer 12111 on the upper surface may be less than that of the indium tin oxide layer 12113 located below. In addition, since an etching rate of the aluminum layer 12112 is greater than that of the indium tin oxide layers 12111 and 12113, the structure with a shape of Chinese character " 工 " as shown in FIG. 15 appears (the commonly used silver Ag layer may be replaced by the Al layer in order to form the structure with a shape of Chinese character " 工 ", and a thickness of the Al layer may be increased in order to obtain a more visible structure with a shape of Chinese character " 工 "). For example, the thickness of the aluminum layer 12112 may be greater than that of the indium tin oxide layer 12111, and the thickness of the aluminum layer 12112 may be greater than that of the indium tin oxide layer 12113. For example, a ratio of the thickness of the aluminum layer 12112 to the thickness of the indium tin oxide layer 12111 is greater than 3:1.

On the basis of the first electrode 1211 having the structure with a shape of Chinese character " 工 ", the light-emitting layer 141 is then evaporated. During the evaporation process, movement directions of atoms in the light-emitting layer 141 are highly consistent, and the movement direction is consistent with respect to a normal direction of the upper surface of the first electrode 1211, so that a part of the indium tin oxide layer 12111 protruding with respect to the aluminum layer 12112 may block the atoms of the light-emitting layer 141 from entering a concave region of the shape of Chinese character " 工 ", thereby forming a cut off light-emitting layer 141 as shown in FIG. 15, so that a part of the indium tin oxide layer 12113 and a side of the aluminum layer 12112 may be exposed. Then, the cathode layer may be prepared by a sputtering process, and the cathode 131 is formed on the light-emitting layer 141 located on the indium tin oxide layer 12111. In addition, since the sputtering process causes the movement direction of the atoms of the cathode material sputtered from a target to be quite different from the normal direction of the surface of the aluminum layer 12112 in FIG. 15, the cathode layer is formed on the exposed part of the indium tin oxide layer 12113 and at least part of the sidewall of the aluminum layer 12112 (a region C shown in the dotted box in the figure), so that the cathode may be conveniently connected to the metal wire located in the anode layer, and the conductivity of the cathode may be improved. In the structure shown in FIG. 15, it is not needed to prepare a via hole through lithography, etching and other processes, which simplifies the process and improves the production efficiency.

In some embodiments, the auxiliary cathode may be improved to reduce an interference of a signal in the signal line caused by the introduction of the auxiliary cathode.

For example, the display substrate 10 further includes a first signal line 1601. Accordingly, the first auxiliary electrode 30 includes a first body portion 301 and a first narrowed portion 302. The first narrowed portion 302 is connected to the first body portion, and an orthographic projection of the first narrowed portion on the substrate overlaps an orthographic projection of the first signal line on the substrate.

For another example, the second auxiliary electrode 40 includes a second body portion and a second narrowed portion. The second narrowed portion is connected to the second body portion, and an orthographic projection of the second narrowed portion on the substrate overlaps an orthographic projection of the first signal line on the substrate.

Figure 16:
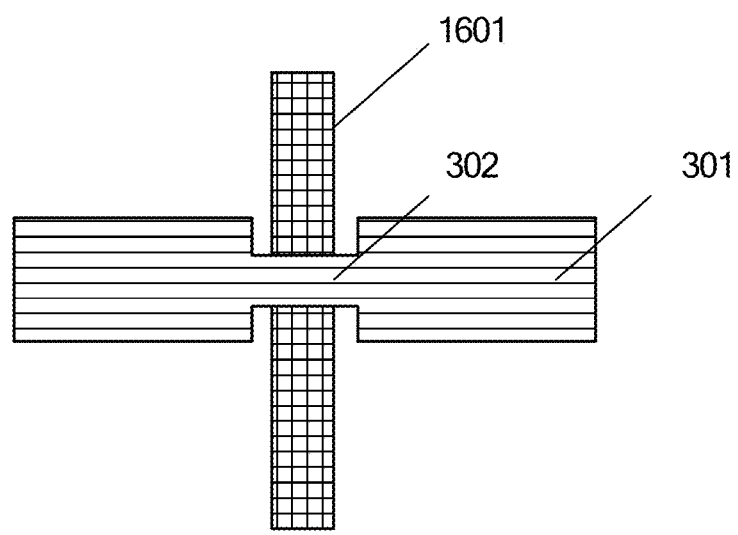
FIG. 16 shows a schematic diagram of a first auxiliary electrode provided by the embodiments of the present disclosure.

FIG. 16 shows a schematic diagram of the first auxiliary electrode provided by the embodiments of the present disclosure.

As shown in FIG. 16, a line width for the auxiliary cathode has a maximum design according to the space. When overlapping other high-frequency signal lines, the auxiliary cathode may be narrowed at the overlap, similar to a dumbbell shape, which may reduce a capacitance (loading) of the auxiliary electrode to a gate line.

Figure 17:
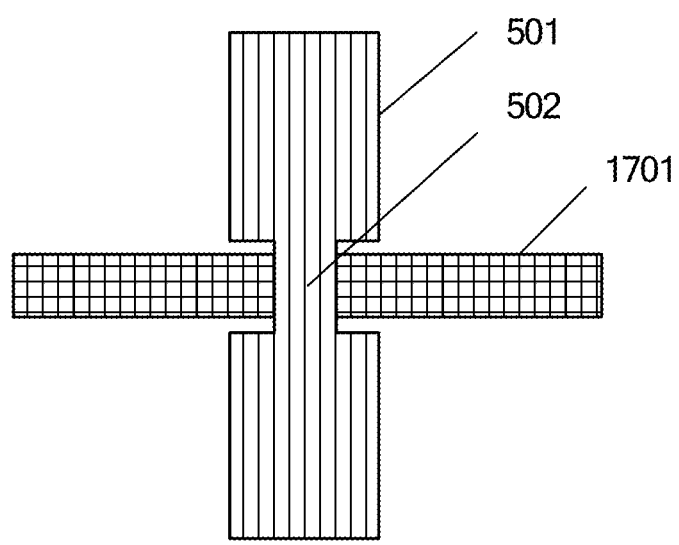
FIG. 17 shows a schematic diagram of a third auxiliary electrode provided by the embodiments of the present disclosure.

FIG. 17 shows a schematic diagram of the third auxiliary electrode provided by the embodiments of the present disclosure.

In some embodiments, the display substrate 10 may further include a second signal line 1701. Accordingly, the third auxiliary electrode 50 includes a third body portion 501 and a third narrowed portion 502. The third narrowed portion 502 is connected to the third body portion 501, and an orthographic projection of the third narrowed portion 502 on the substrate overlaps an orthographic projection of the second signal line on the substrate.

FIG. 17 shows a schematic diagram of an overlap between the auxiliary cathode extending in the column direction and located in the layer of the source and/or drain electrode (referred to as the SD layer) and the gate line extending in the row direction.

At least some embodiments of the present disclosure further provide a display panel including the display substrate 10 described above. For example, the above-mentioned display panel may be an OLED display panel.

FIG. 18 shows a schematic structural diagram of the display panel provided by the embodiments of the present disclosure.

As shown in FIG. 18, the display panel 1 may include the display substrate 10 illustrated above.

In the top-emitting OLED display panel, the cathode contains a transparent conductive material. When the current flows through the cathode, because the transparent cathode has a large impedance, a large voltage drop (IR Drop) may be generated. Further, with an increase of a size of the display panel, the voltage drop of the cathode increases significantly, which results in uneven luminance of the display. Therefore, the auxiliary cathode may be used in a large size top-emitting OLED display panel to reduce the cathode impedance and meet the voltage drop required for display.

For example, the OLED display panel includes a cover plate and a back plate that are assigned. Referring to FIG. 18, the cover plate includes a substrate 101 as well as a black matrix 102, a color filter layer 103, a planarization layer 104, a filling layer 108 and a spacer 113 formed on the cover plate substrate 101. The back plate includes a substrate 115 as well as a pixel defining layer 114, a light-emitting layer 110, a cathode 109 and other film layers formed on the substrate 115 (an anode, a first auxiliary cathode, a second auxiliary cathode, a third auxiliary cathode and other structures are also formed on the substrate 115, reference may be made to the relevant parts of FIG. 2 to FIG. 10). The cover plate and the back plate are assembled together by a sealant 107.

In the embodiments of the present disclosure, the auxiliary cathode of the pixel unit overlaps the transparent cathode. The auxiliary cathode is designed using the existing space without occupying too much border region. In addition, the purpose of reducing the resistance of the pixel cathode is achieved, which may effectively reduce the problem of VSS IR Rise.

The embodiments of the present disclosure further provide a method of manufacturing a display substrate.

FIG. 19 shows a flowchart of a method of manufacturing a display substrate according to the embodiments of the present disclosure.

As shown in FIG. 19, the method of manufacturing the display substrate may include operation S191 to operation S193.

In operation S191, a substrate including a plurality of pixel units is provided, where the plurality of pixel units are arranged on the substrate in an array in a row direction and a column direction, and the plurality of pixel units include at least a first pixel unit 12 including a first light-emitting region 121 and a first non-light-emitting region.

In operation S192, a scan driving circuit is formed in the first non-light-emitting region.

In operation S193, a first auxiliary electrode is formed on a side of the scan driving circuit away from the substrate, and the first auxiliary electrode is located in a first partial region of the first non-light-emitting region.

The first light-emitting region 121 includes a first light-emitting element including a first electrode 1211, a light-emitting layer 141 and a second electrode, and the first auxiliary electrode 30 may be arranged in the row direction or the column direction. The scan driving circuit includes a plurality of scan driving sub-circuits located in a second partial region in the first non-light-emitting region and arranged between the substrate and the first electrode 1211. An orthographic projection of the first partial region in the first non-light-emitting region on the substrate overlaps an orthographic projection of the second partial region in the first non-light-emitting region on the substrate, and the first auxiliary electrode 30 is electrically connected to the second electrode. For example, the first auxiliary electrode 30 is located in the same layer as the first electrode 1211.

Regarding the pixel unit, the light-emitting region, the non-light-emitting region, the scan driving circuit, the light-emitting element, the first electrode, the light-emitting layer, the second electrode and the positional relationship thereof, reference may be made to the above related embodiments, which will not be described in detail here.

Figure 20:
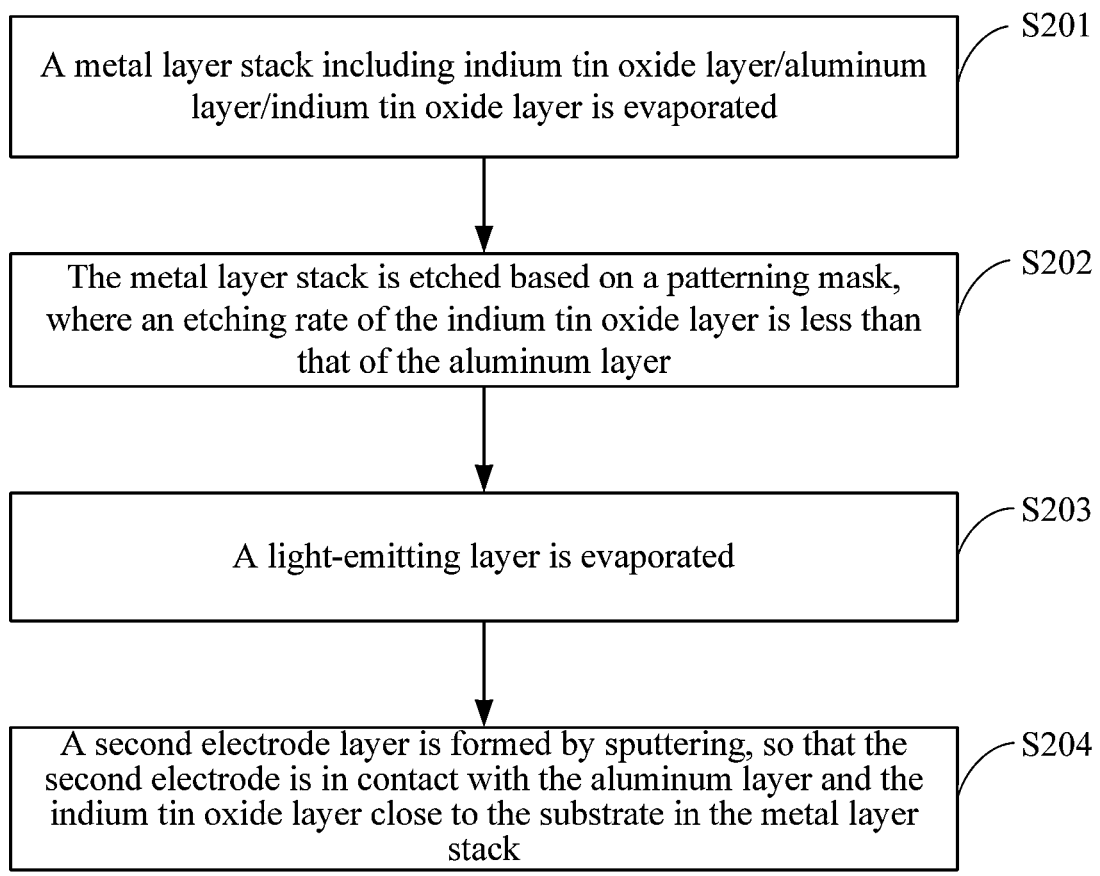
FIG. 20 shows a flowchart of a method of manufacturing a light-emitting element according to the embodiments of the present disclosure.

FIG. 20 shows a flowchart of a method of manufacturing the light-emitting element according to the embodiments of the present disclosure.

As shown in FIG. 20, the first light-emitting element is prepared by operation S201 to operation S204.

In operation S201, a metal layer stack including indium tin oxide layer, aluminum layer and indium tin oxide layer is evaporated.

In operation S202, the metal layer stack is etched based on a patterning mask, where an etching rate of the indium tin oxide layer is less than that of the aluminum layer.

Specifically, referring to FIG. 15, a first electrode 1211 (the anode of the OLED) with a shape of Chinese character "工" may be formed through an imaging process.

In operation S203, a light-emitting layer 141 is evaporated. A thickness of the light-emitting layer 141 is less than that of the first electrode 1211, the light-emitting layer 141 may be automatically cut off by the structure with the shape of Chinese character "工", and a part of a surface of the indium tin oxide layer 12113 and a sidewall of the aluminum layer 11112 may be exposed (the region C shown in FIG. 15).

In operation S204, a second electrode layer is formed by sputtering, so that the second electrode is in contact with the aluminum layer and the indium tin oxide layer close to the substrate in the metal layer stack.

Referring to FIG. 15, the cathode is in contact with the electrode wire in the region C, so that the electrode wire acts as an auxiliary cathode to reduce the resistance of the cathode.

Another aspect of the present disclosure provides a display device.

Figure 21:
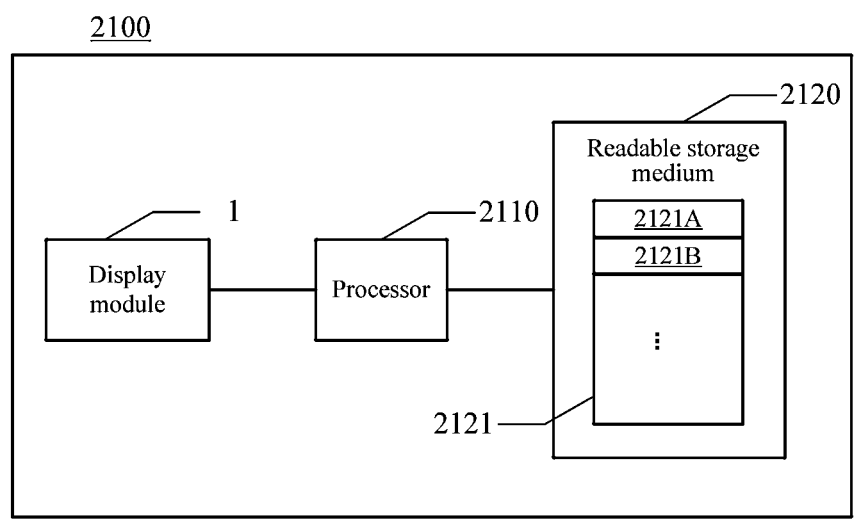
FIG. 21 shows a block diagram of a display device provided by the embodiments of the present disclosure.

FIG. 21 shows a block diagram of a display device provided by the embodiments of the present disclosure.

As shown in FIG. 21, the display device 2100 includes one or more display panels 1 illustrated above. The above-mentioned display panel 1 includes a display region and a non-display region, and the non-display region has a smaller width, thereby achieving a display device with a narrow border.

For example, the display device 2100 may include one or more processors 2110 and a computer-readable storage medium 2120.

Specifically, the processor 2110 may include, for example, a general-purpose microprocessor, an instruction set processor and/or a related chipset and/or a special-purpose microprocessor (for example, an application specific integrated circuit (ASIC)), and the like. The processor 2110 may further include an on-board memory for caching purposes.

The computer-readable storage medium 2120, for example, may be a non-transitory computer-readable storage medium. Specific examples include, but are not limited to: a magnetic storage device, such as a magnetic tape or a hard disk (HDD); an optical storage device, such as a compact disc (CD-ROM); a memory, such as a random access memory (RAM) or a flash memory.

The computer-readable storage medium 2120 may contain a program 2121. The program 2121 may contain code/computer-executable instructions that, when executed by the processor 2110, cause the processor 2110 to process image display data. For example, in an exemplary embodiment, the code in the program 2121 may contain one or more program modules, such as 2121A, 2121B, . . . .

The display device described above may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

Although the present disclosure has been described with reference to the drawings, the embodiments disclosed in the drawings are intended to exemplify the embodiments of the present disclosure, and should not be understood as a limitation of the present disclosure. Size ratios in the drawings are only schematic and should not be construed as limiting the present disclosure.

The embodiments described above merely illustrate the principle and structure of the present disclosure, but are not used to limit the present disclosure. Those skilled in the art should understand that any changes and improvements made to the present disclosure without departing from the general idea of the present disclosure fall within the scope of the present disclosure. The protection scope of the present disclosure shall be determined by the scope defined by the claims of the present disclosure.

What is claimed is:

1. A display substrate, comprising:
    a substrate;
    a plurality of pixel units arranged on the substrate in an array in a row direction and a column direction, wherein the plurality of pixel units comprise at least a first pixel unit comprising a first light-emitting region and a first non-light-emitting region;
    a first light-emitting element arranged in the first light-emitting region, wherein the first light-emitting element comprises a first electrode, a light-emitting layer and a second electrode;
    a scan driving circuit arranged in the first non-light-emitting region; and
    a first auxiliary electrode arranged on a side of the scan driving circuit away from the substrate, wherein the first auxiliary electrode is located in a first partial region in the first non-light-emitting region,
    wherein the first auxiliary electrode is arranged in the row direction or the column direction; the scan driving circuit comprises a plurality of scan driving sub-circuits located in a second partial region in the first non-light-emitting region; an orthographic projection of the first partial region in the first non-light-emitting region on the substrate overlaps an orthographic projection of the second partial region in the first non-light-emitting region on the substrate, the first auxiliary electrode is electrically connected to the second electrode, and the first auxiliary electrode is located in the same layer as the first electrode.

2. The display substrate of claim 1, wherein the plurality of pixel units further comprise a second pixel unit comprising a second light-emitting region and a second non-light-emitting region, and no scan driving circuit is provided in the second non-light-emitting region.

3. The display substrate of claim 2, further comprising:
    a second light-emitting element arranged in the second light-emitting region, wherein the second light-emitting element comprises a third electrode, a light-emitting layer and a fourth electrode; and
    a second auxiliary electrode located in a first partial region in the second non-light-emitting region,
    wherein the second auxiliary electrode is located in the same layer as the third electrode, the third electrode is located in the same layer as the first electrode, the second auxiliary electrode is arranged parallel to the first auxiliary electrode, and the second auxiliary electrode is electrically connected to the fourth electrode.

4. The display substrate of claim 3, further comprising:
    a source and/or drain electrode arranged on a side of a layer of the third electrode close to the substrate, wherein the source and/or drain electrode is located in the second non-light-emitting region; and
    a third auxiliary electrode located in a second partial region in the second non-light-emitting region, wherein an orthographic projection of an extension direction of the third auxiliary electrode on the substrate is in contact with an orthographic projection of an extension direction of the second auxiliary electrode on the substrate, an orthographic projection of the source and/or drain electrode on the substrate is spaced apart from an orthographic projection of the second partial region in the second non-light-emitting region on the substrate, the third auxiliary electrode is arranged in the same layer as the source and/or drain electrode, and the third auxiliary electrode is electrically connected to the second auxiliary electrode.

5. The display substrate of claim 4, wherein,
    one second auxiliary electrode corresponds to one or more rows of second pixel units; and/or
    one third auxiliary electrode corresponds to one or more columns of second pixel units.

6. The display substrate of claim 4, further comprising a first signal line;
    wherein the first auxiliary electrode comprises:
        a first body portion; and
        a first narrowed portion connected to the first body portion, wherein an orthographic projection of the first narrowed portion on the substrate overlaps an orthographic projection of the first signal line on the substrate; and/or
    wherein the second auxiliary electrode comprises:
        a second body portion; and
        a second narrowed portion connected to the second body portion, wherein an orthographic projection of the second narrowed portion on the substrate overlaps an orthographic projection of the first signal line on the substrate.

7. The display substrate of claim 4, further comprising a second signal line;
wherein the third auxiliary electrode comprises:
a third body portion; and
a third narrowed portion connected to the third body portion, wherein an orthographic projection of the third narrowed portion on the substrate overlaps an orthographic projection of the second signal line on the substrate.

8. The display substrate of claim 4, further comprising:
a non-display region; and
a second electrode bus arranged in the non-display region for transmitting a reference voltage signal to the second electrode; and/or a fourth electrode bus arranged in the non-display region for transmitting a reference voltage signal to the fourth electrode,
wherein the first auxiliary electrode and the second auxiliary electrode are arranged in the same layer as the second electrode bus, the first auxiliary electrode is connected to the second electrode bus, and the second auxiliary electrode is connected to the second electrode bus; or
wherein the third auxiliary electrode is arranged in the same layer as the fourth electrode bus, and the third auxiliary electrode is connected to the fourth electrode bus.

9. The display substrate of claim 4, further comprising:
a stack of a planarization layer and an insulating layer arranged between the second auxiliary electrode and the third auxiliary electrode, wherein the planarization layer comprises a first via hole, the insulating layer comprises a second via hole, and an orthographic projection of the first via hole on the substrate overlaps an orthographic projection of the second via hole on the substrate; and
the third auxiliary electrode is electrically connected to the second auxiliary electrode through the first via hole and the second via hole.

10. The display substrate of claim 9, wherein the first via hole and the second via hole are circular via holes, and a diameter of the second via hole is greater than a diameter of the first via hole; or the first via hole and the second via hole are polygonal via holes, and an area of the second via hole is greater than an area of the first via hole.

11. The display substrate of claim 9, further comprising:
a pixel defining layer arranged between the second electrode and the first auxiliary electrode, wherein the pixel defining layer comprises a third via hole, and the first auxiliary electrode is electrically connected to the second electrode through the third via hole; or
a pixel defining layer arranged between the fourth electrode and the second auxiliary electrode, wherein the pixel defining layer comprises a third via hole, and the second auxiliary electrode is electrically connected to the fourth electrode through the third via hole.

12. The display substrate of claim 11, wherein the first via hole is a polygonal via hole, the third via hole is a strip via hole, and an area of the strip via hole is greater than an area of the first via hole; and/or
an orthographic projection of the first via hole is spaced apart from an orthographic projection of the third via hole on the substrate.

13. The display substrate of claim 11, wherein,
an orthographic projection of the pixel defining layer on the substrate covers the first non-light-emitting region; and/or
the orthographic projection of the pixel defining layer on the substrate covers the second non-light-emitting region.

14. The display substrate of claim 1, wherein,
one first auxiliary electrode corresponds to one or more rows of first pixel units; and/or
one scan driving sub-circuit corresponds to one or more columns of first pixel units; and/or
a shape of the display substrate comprises one of a square, a rectangle, a polygon and a shape with an arc boundary; and/or
the first non-light-emitting region is an L-shaped region.

15. The display substrate of claim 1, wherein for a display substrate with a heart-shaped boundary, a plurality of pixel units are respectively located in different display regions, and each display region has an exclusive scan driving sub-circuit,
wherein the display substrate with the heart-shaped boundary comprises a display region at a tip of the heart-shape and two symmetrical display regions at a head of the heart-shape, and the scan driving sub-circuit is arranged in the column direction.

16. The display substrate of claim 1, wherein the first electrode comprises a multi-layer metal structure having a cross-section with a shape of Chinese character "I",
wherein the first electrode comprises a stack of indium tin oxide layer, aluminum layer and indium tin oxide layer.

17. The display substrate of claim 1, wherein the light-emitting layer comprises an organic light emitting diode, the first electrode and the third electrode are an anode of the organic light emitting diode, and the second electrode and the fourth electrode are a cathode of the organic light emitting diode; and
the scan driving circuit comprises a gate driving circuit, wherein the cathode contains a transparent conductive material, and the anode contains a metal material.

18. A display panel comprising the display substrate of claim 1.

19. A method of manufacturing a display substrate, comprising:
providing a substrate comprising a plurality of pixel units, wherein the plurality of pixel units are arranged on the substrate in an array in a row direction and a column direction, the plurality of pixel units comprise at least a first pixel unit comprising a first light-emitting region and a first non-light-emitting region;
forming a scan driving circuit in the first non-light-emitting region; and
forming a first auxiliary electrode on a side of the scan driving circuit away from the substrate, wherein the first auxiliary electrode is located in a first partial region in the first non-light-emitting region,
wherein the first light-emitting region comprises a first light-emitting element comprising a first electrode, a light-emitting layer and a second electrode, and the first auxiliary electrode is arranged in the row direction or the column direction; the scan driving circuit comprises a plurality of scan driving sub-circuits located in a second partial region in the first non-light-emitting region and arranged between the substrate and the first electrode; an orthographic projection of the first partial region in the first non-light-emitting region on the substrate overlaps an orthographic projection of the second partial region in the first non-light-emitting region on the substrate, the first auxiliary electrode is electrically connected to the second electrode, and the first auxiliary electrode is located in the same layer as the first electrode, wherein the first light-emitting element is prepared by:
evaporating a metal layer stack comprising indium tin oxide layer, aluminum layer and indium tin oxide layer;

etching the metal layer stack based on a patterned mask, wherein an etching rate of the indium tin oxide layer is less than an etching rate of the aluminum layer;

evaporating a light-emitting layer; and forming a second electrode layer by sputtering, so that the second electrode is in contact with the aluminum layer and the indium tin oxide layer close to the substrate in the metal layer stack.

* * * * *